(12) United States Patent
Huang et al.

(10) Patent No.: US 12,020,980 B2
(45) Date of Patent: Jun. 25, 2024

(54) SEMICONDUCTOR STRUCTURE AND FORMING METHOD THEREOF

(71) Applicant: Taiwan Semiconductor Manufacturing Company, Ltd., Hsinchu (TW)

(72) Inventors: Soon-Kang Huang, Hsin Chu (TW); Hsing-Chi Chen, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/647,925

(22) Filed: Jan. 13, 2022

(65) Prior Publication Data

US 2023/0016445 A1     Jan. 19, 2023

Related U.S. Application Data

(60) Provisional application No. 63/203,081, filed on Jul. 7, 2021.

(51) Int. Cl.
*H01L 21/762* (2006.01)
*H01L 21/84* (2006.01)
*H01L 27/12* (2006.01)

(52) U.S. Cl.
CPC .. *H01L 21/76272* (2013.01); *H01L 21/76283* (2013.01); *H01L 21/84* (2013.01); *H01L 27/1207* (2013.01)

(58) Field of Classification Search
CPC ......... H01L 21/76272; H01L 21/76283; H01L 21/823481; H01L 29/66272; H01L 29/76854; H01L 21/84; H01L 27/1207
USPC .......................................... 257/401; 438/284
See application file for complete search history.

(56) References Cited

U.S. PATENT DOCUMENTS

| | | | |
|---|---|---|---|
| 7,452,761 B2 | 11/2008 | Zhu et al. | |
| 8,183,627 B2 | 5/2012 | Currie | |
| 8,466,012 B1 | 6/2013 | Chang et al. | |
| 2010/0156526 A1 | 6/2010 | Botula | |
| 2012/0083107 A1 | 4/2012 | Chang et al. | |
| 2017/0243782 A1* | 8/2017 | Wu et al. | H01L 21/76283 |
| 2020/0083092 A1 | 3/2020 | Yen | |

* cited by examiner

*Primary Examiner* — Victoria K. Hall
(74) *Attorney, Agent, or Firm* — Haynes and Boone, LLP

(57) ABSTRACT

A semiconductor structure and a method for forming a semiconductor structure are provided. The method includes receiving a semiconductor substrate having a first region and a second region; forming a dielectric layer over the semiconductor substrate; removing portions of the dielectric layer to form a dielectric structure in the first region, wherein the dielectric structure includes a base structure and a plurality of first isolation structures over the base structure; forming a semiconductor layer covering the first region and the second region; removing a portion of the semiconductor layer to expose a top surface of the plurality of first isolation structures; and forming a plurality of second isolation structures in the second region.

20 Claims, 34 Drawing Sheets

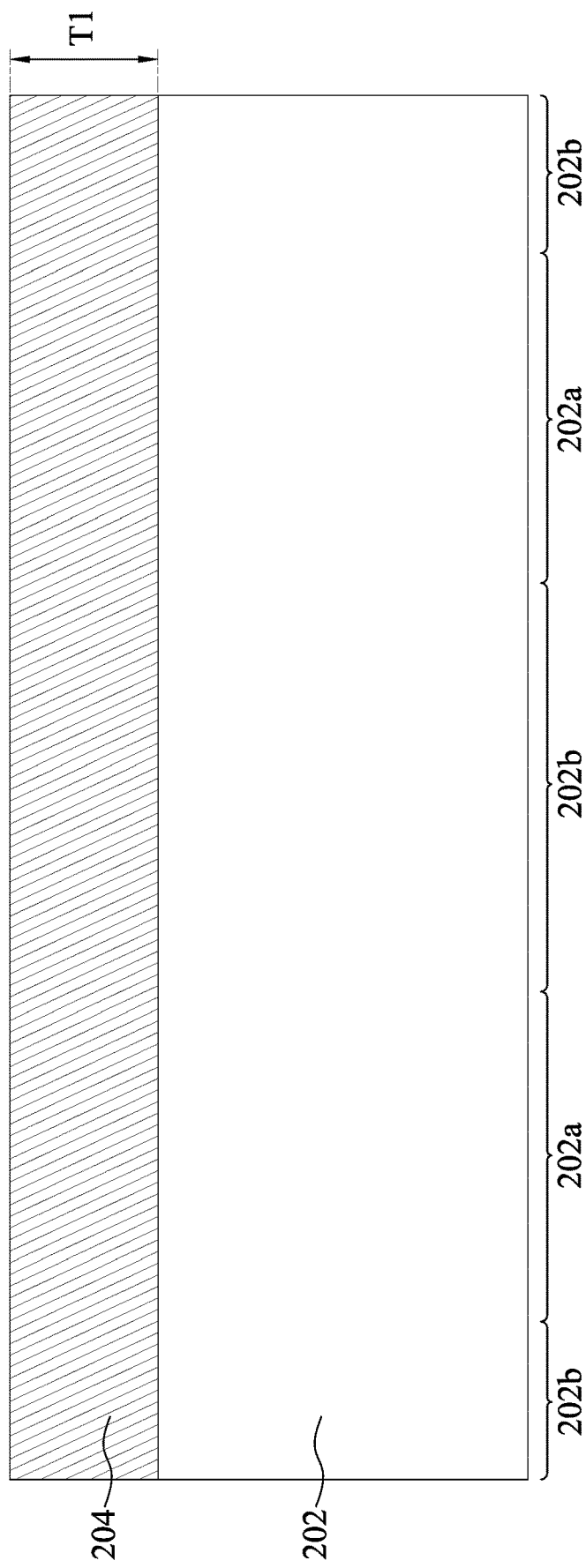

SEMICONDUCTOR STRUCTURE AND FORMING METHOD THEREOF

PRIORITY CLAIM AND CROSS-REFERENCE

This application claims the benefit of U.S. Provisional Application No. 63/203,081 filed on Jul. 7, 2021, entitled "SEMICONDUCTOR STRUCTURE AND RELATED METHODS," which is hereby incorporated by reference in its entirety.

BACKGROUND

Electronic equipment involving semiconductor devices is essential for many modern applications. Technological advances in materials and design have produced generations of semiconductor devices where each generation has smaller and more complex circuits than the previous generation. The desire for higher performance circuits has driven the development of silicon-on-insulator (SOI) technology. In SOI technology, metal-oxide semiconductor field-effect transistors (MOSFETs) are formed on an active layer overlying a layer of insulating material. Devices formed on SOI offer many advantages over their bulk counterparts, including reduced junction capacitance and full dielectric isolation. However, there are challenges in improving the performance of the devices and reducing manufacturing costs.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIGS. 3A to 3C are cross-sectional views illustrating a semiconductor structure at different fabrication stages constructed according to aspects of one or more embodiments of the present disclosure.

DETAILED DESCRIPTION

Figure 1:
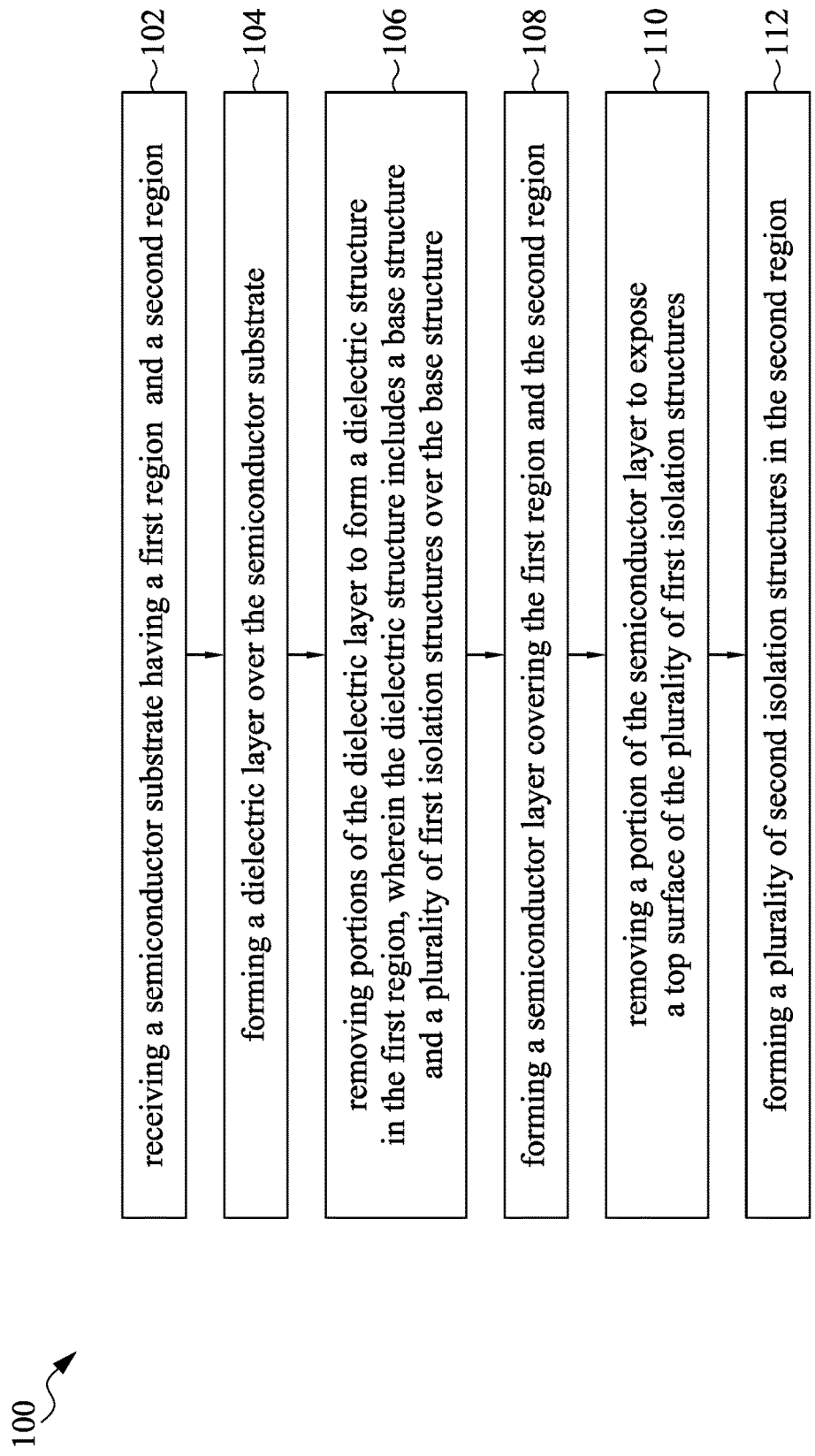
FIG. 1 is a flowchart representing a method 100 for forming a semiconductor structure according to aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Techniques for fabricating MOS devices on hybrid substrates (or composite substrates) have been developed. Such substrates may have multiple device regions that are independently optimized for different devices. The hybrid substrate may include a first device region having a bulk substrate and a second device region having an SOI substrate. Alternatively, the hybrid substrate may include a thick active layer in a first device region and a thin active layer overlying an insulating layer in a second device region.

Isolation structures (or isolation regions) of different devices formed in different regions are designed to have different heights. Many problems encountered in MOS fabrication involve forming the isolation structures of different heights in different regions. For example, the methods that include forming isolation structures suffer yield losses. Alternative approaches to forming the isolation structures on the hybrid substrate is therefore of benefit.

Some embodiments of the present disclosure provide a semiconductor structure and a forming method thereof. In some embodiments, the method includes forming isolation structures of different heights in different regions in separate operations. In some embodiments, the method includes defining different portions of the dielectric structure in separate steps. Hence, greater packing density and lower manufacturing costs may be achieved. Furthermore, better dielectric isolation and lower leakage may be achieved.

FIG. 1 is a flowchart representing a method 100 for forming a semiconductor structure according to aspects of one or more embodiments of the present disclosure. The method 100 for forming the semiconductor structure includes an operation 102, in which a semiconductor substrate is received. In some embodiments, the semiconductor substrate has a first region and a second region. The method 100 further includes an operation 104, in which a dielectric layer is formed over the semiconductor substrate. The method 100 further includes an operation 106, in which portions of the dielectric layer are removed to form a dielectric structure in the first region. In some embodiments, the dielectric structure includes a base structure and a plurality of first isolation structures over the base structure. The method 100 further includes an operation 108, in which a semiconductor layer is formed covering the first region and the second region. The method 100 further includes an operation 110, in which a portion of the semiconductor layer is removed to expose a top surface of the plurality of first isolation structures. The method 100 further includes an operation 112, in which a plurality of second isolation structures are formed in the second region.

The method is described for a purpose of illustrating concepts of the present disclosure and the description is not intended to limit the present disclosure beyond what is explicitly recited in the claims. Additional operations can be provided before, during, and after the method illustrated above and in FIG. 1, and some operations described can be replaced, eliminated, or moved around for additional embodiments of the method.

Figure 2A:
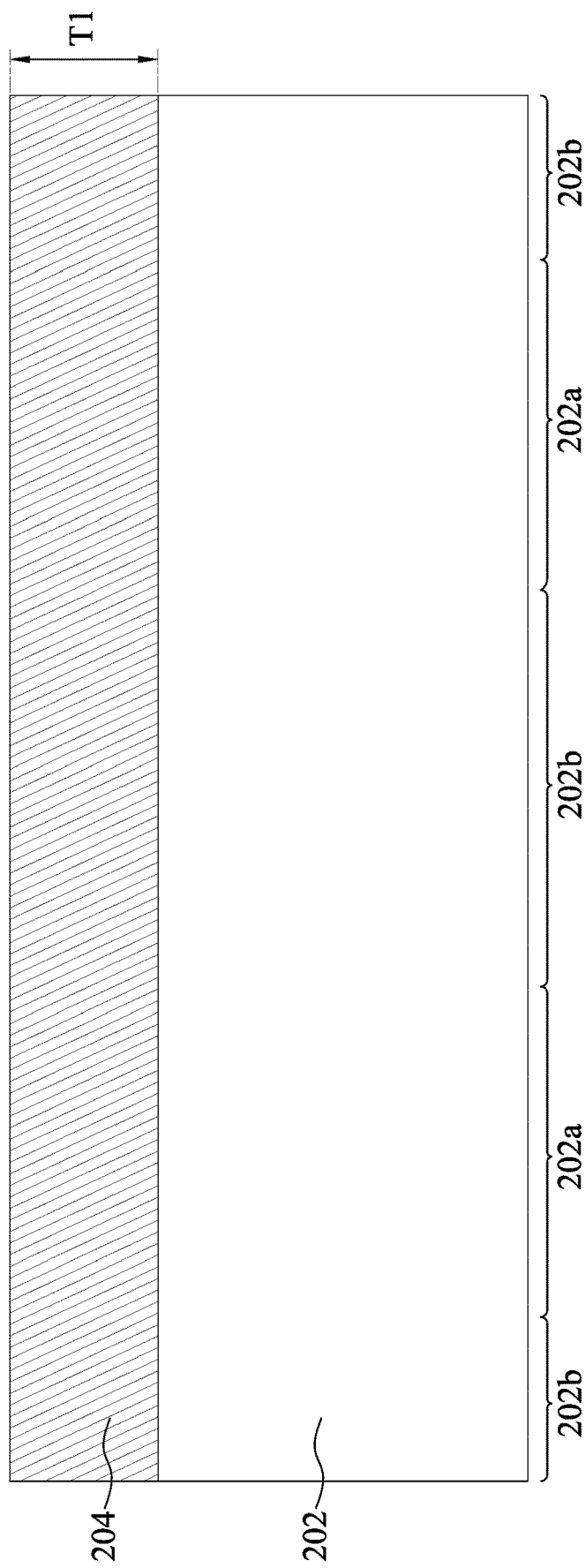
FIGS. 2A to 2N are cross-sectional views illustrating a semiconductor structure at different fabrication stages constructed according to aspects of one or more embodiments of the present disclosure.
Figure 2B:
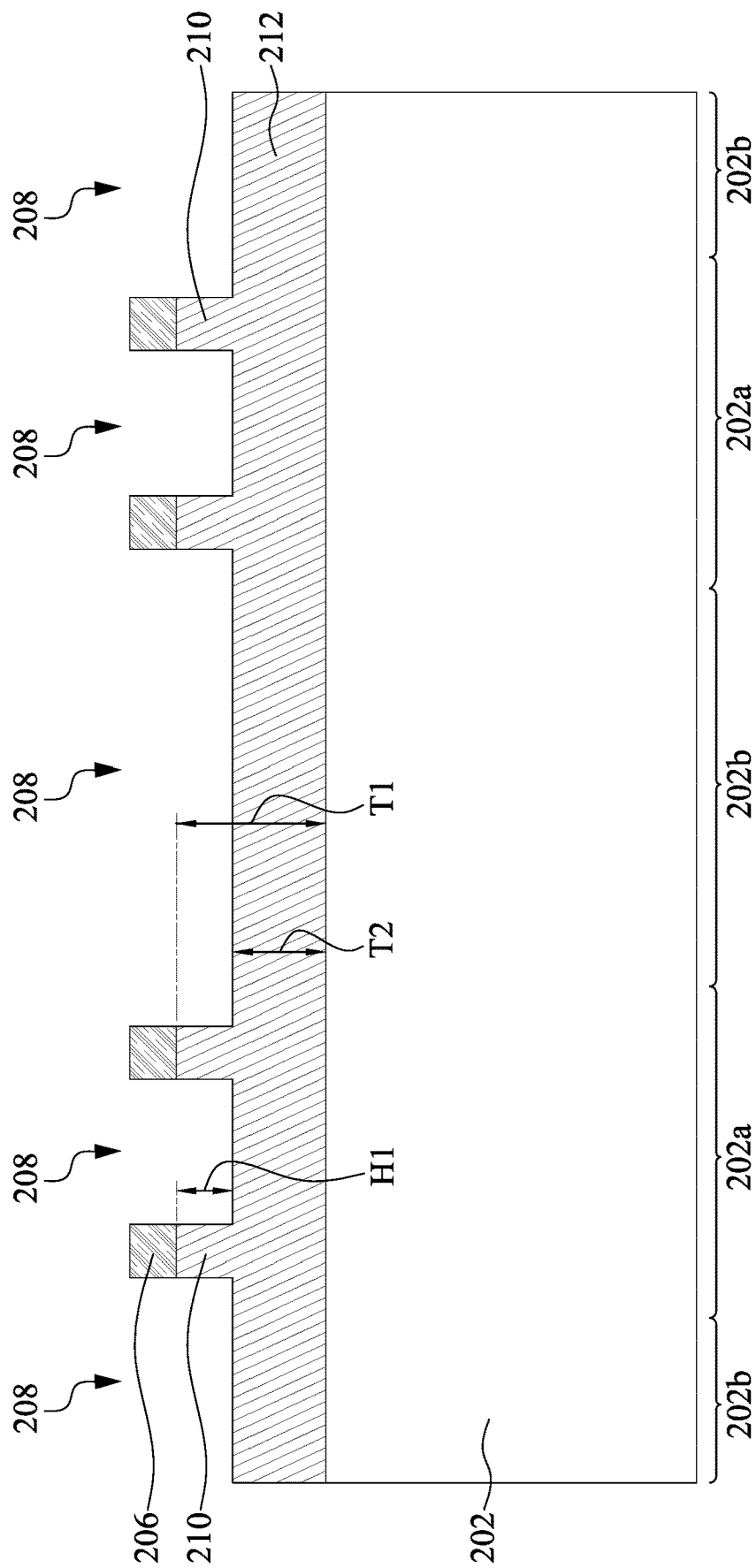
Figure 2C:
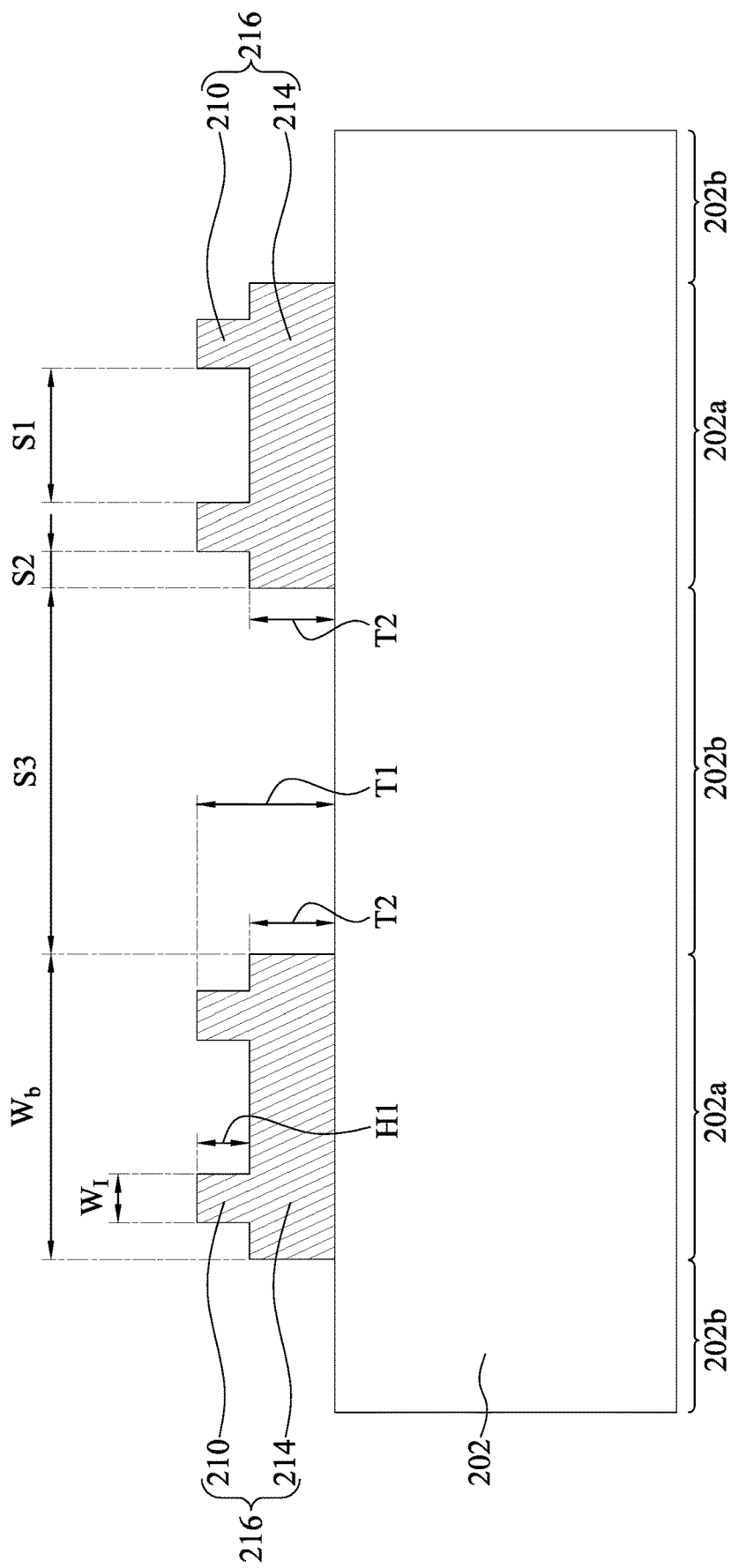
Figure 2D:
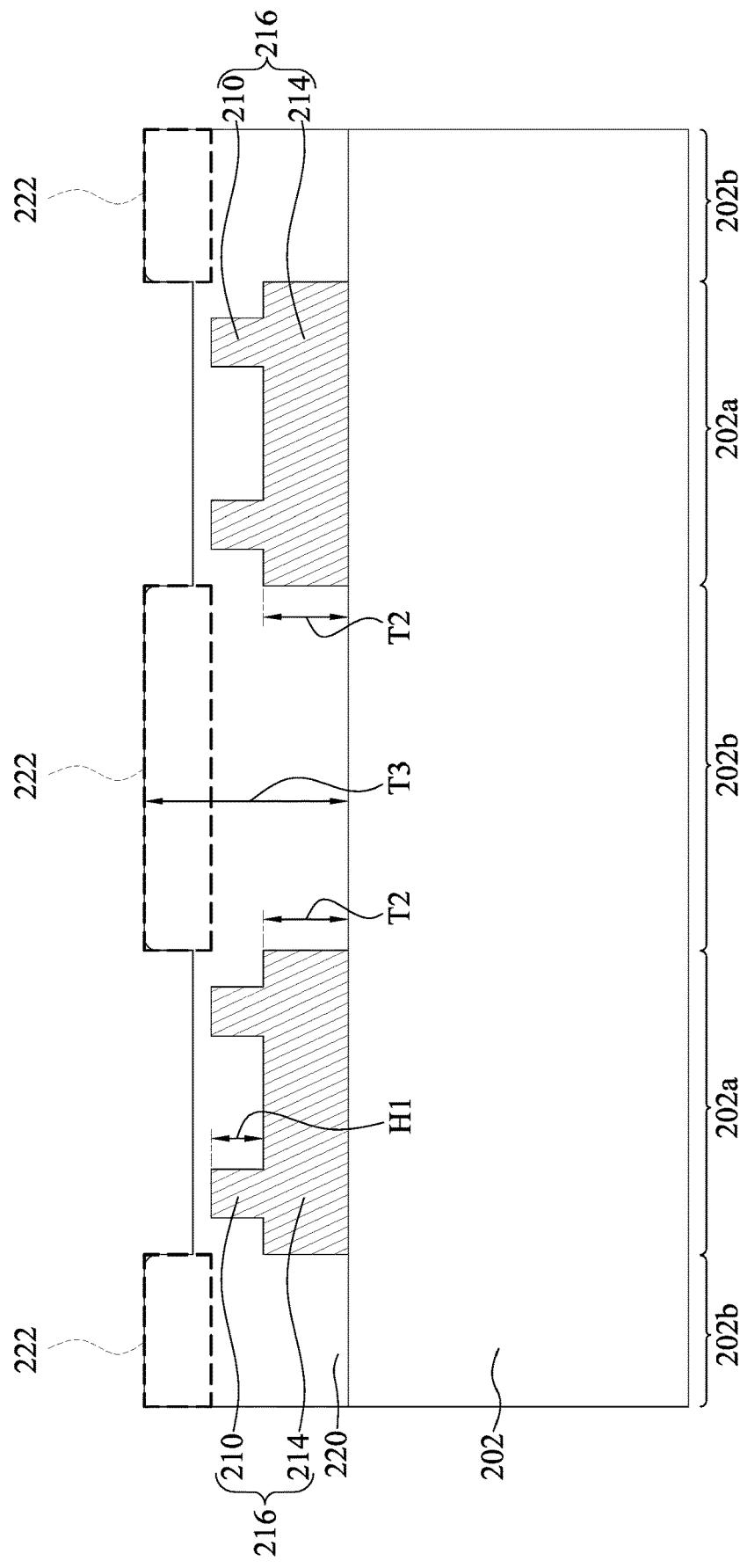
Figure 2E:
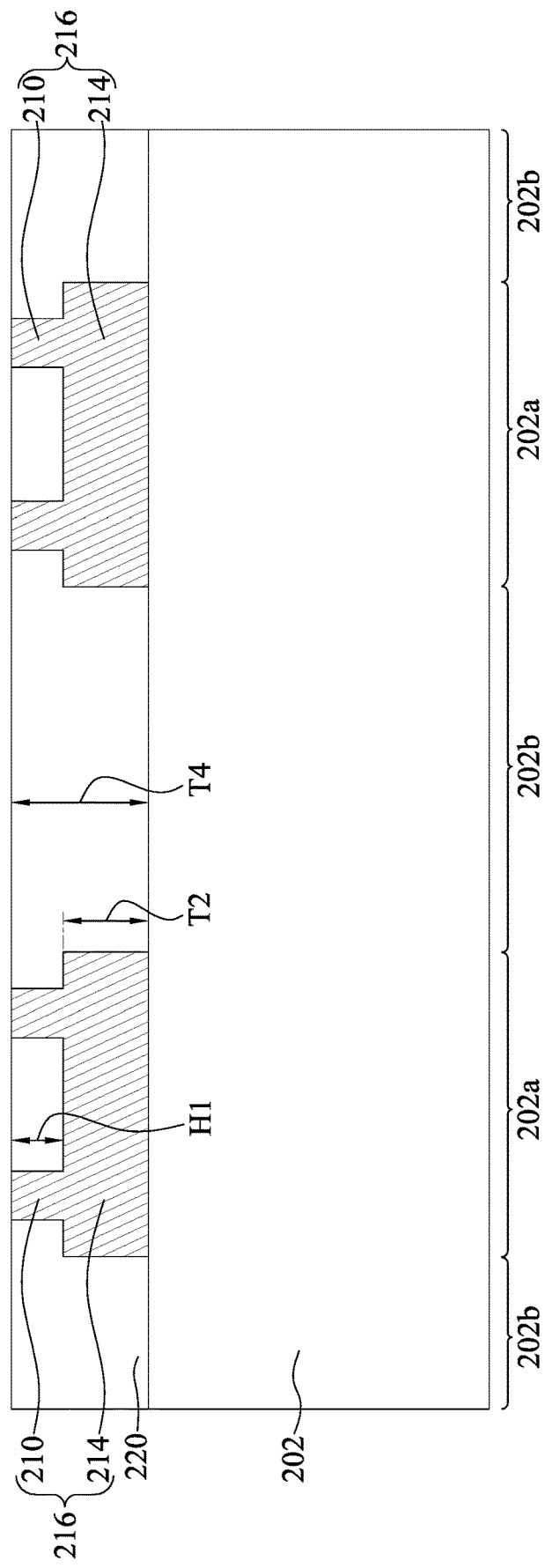
Figure 2F:
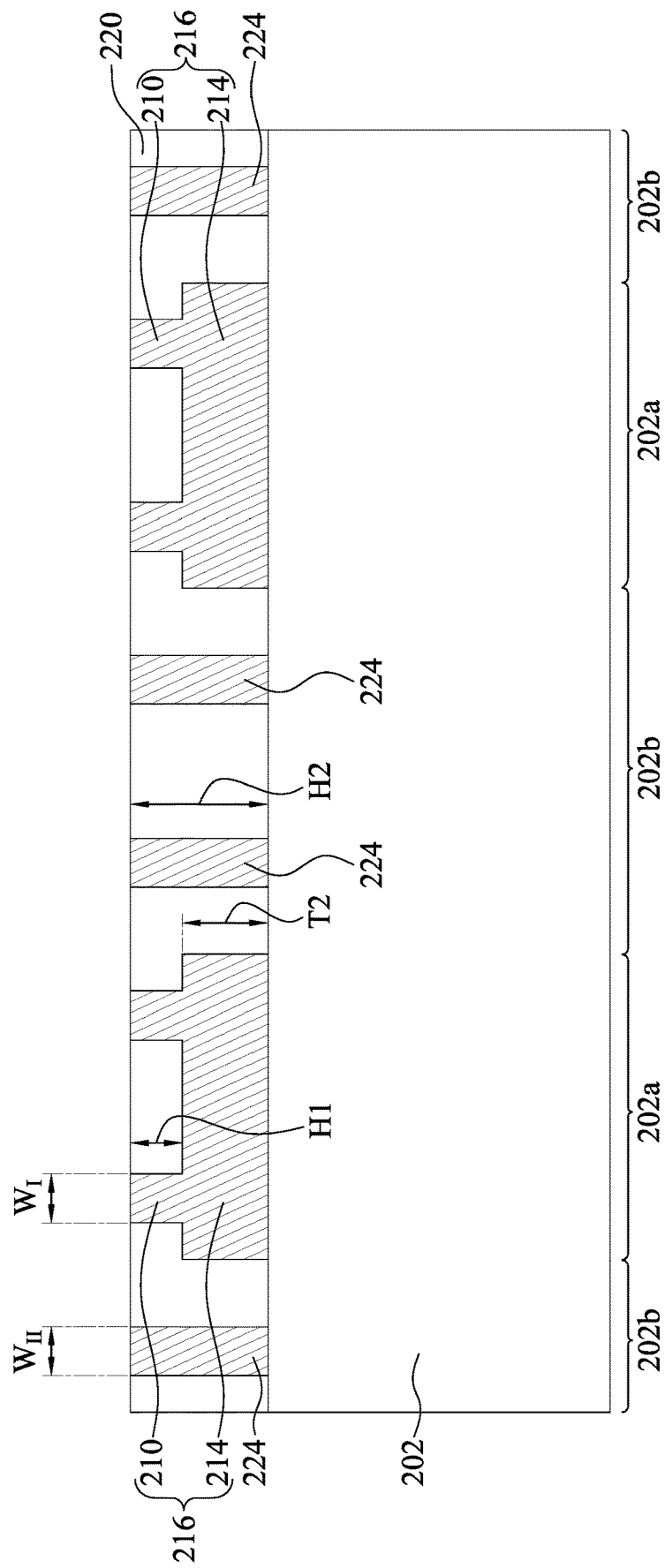
Figure 2G:
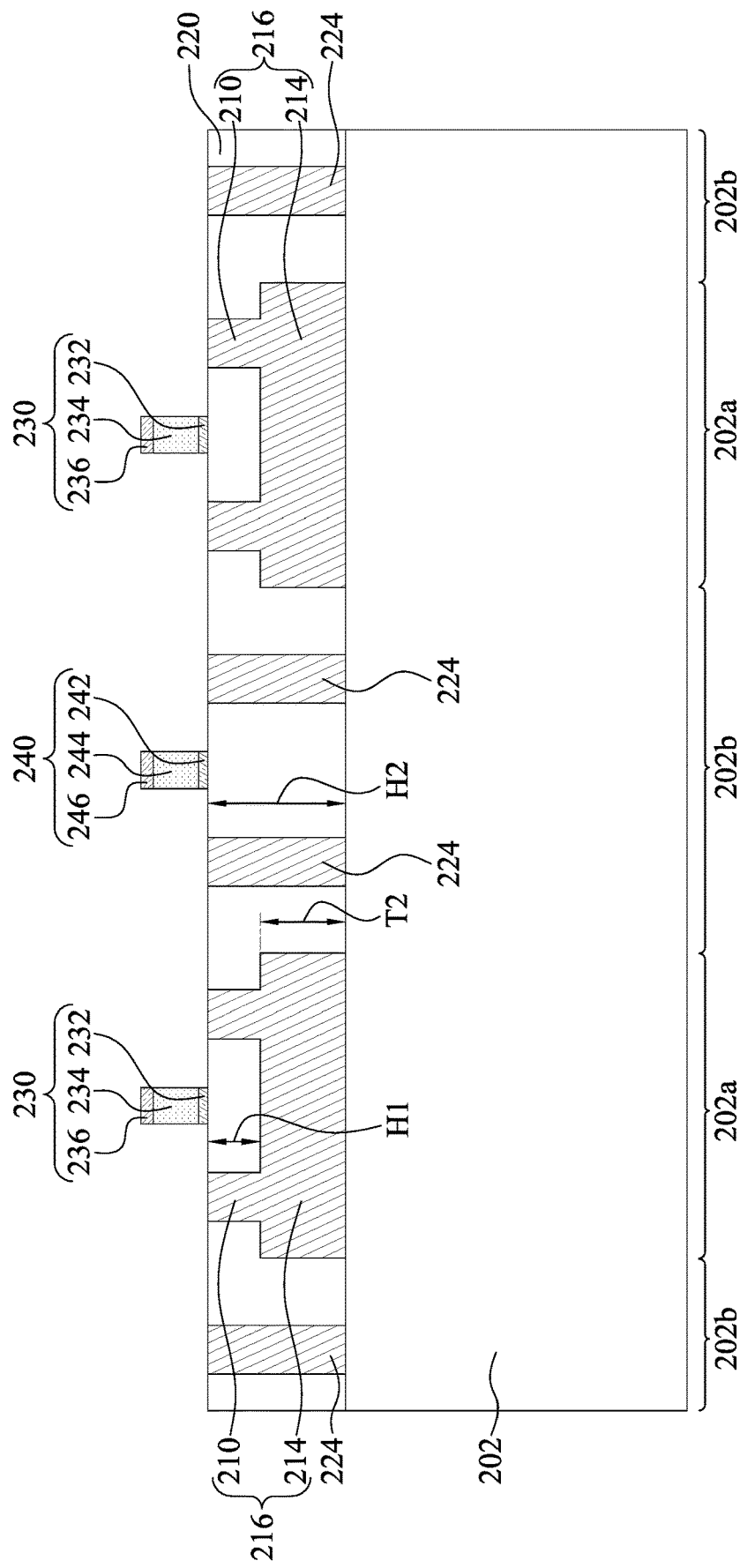
Figure 2H:
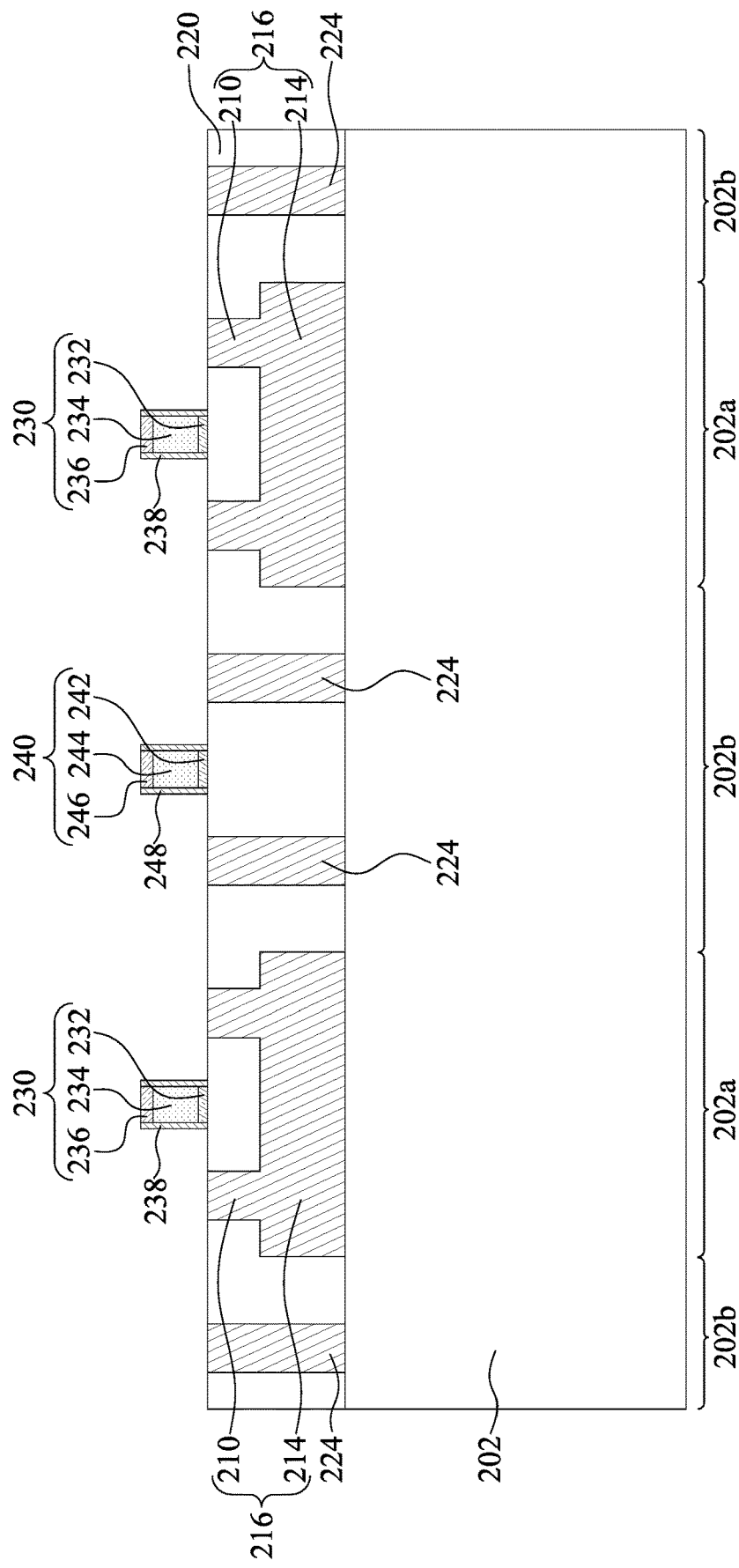
Figure 2I:
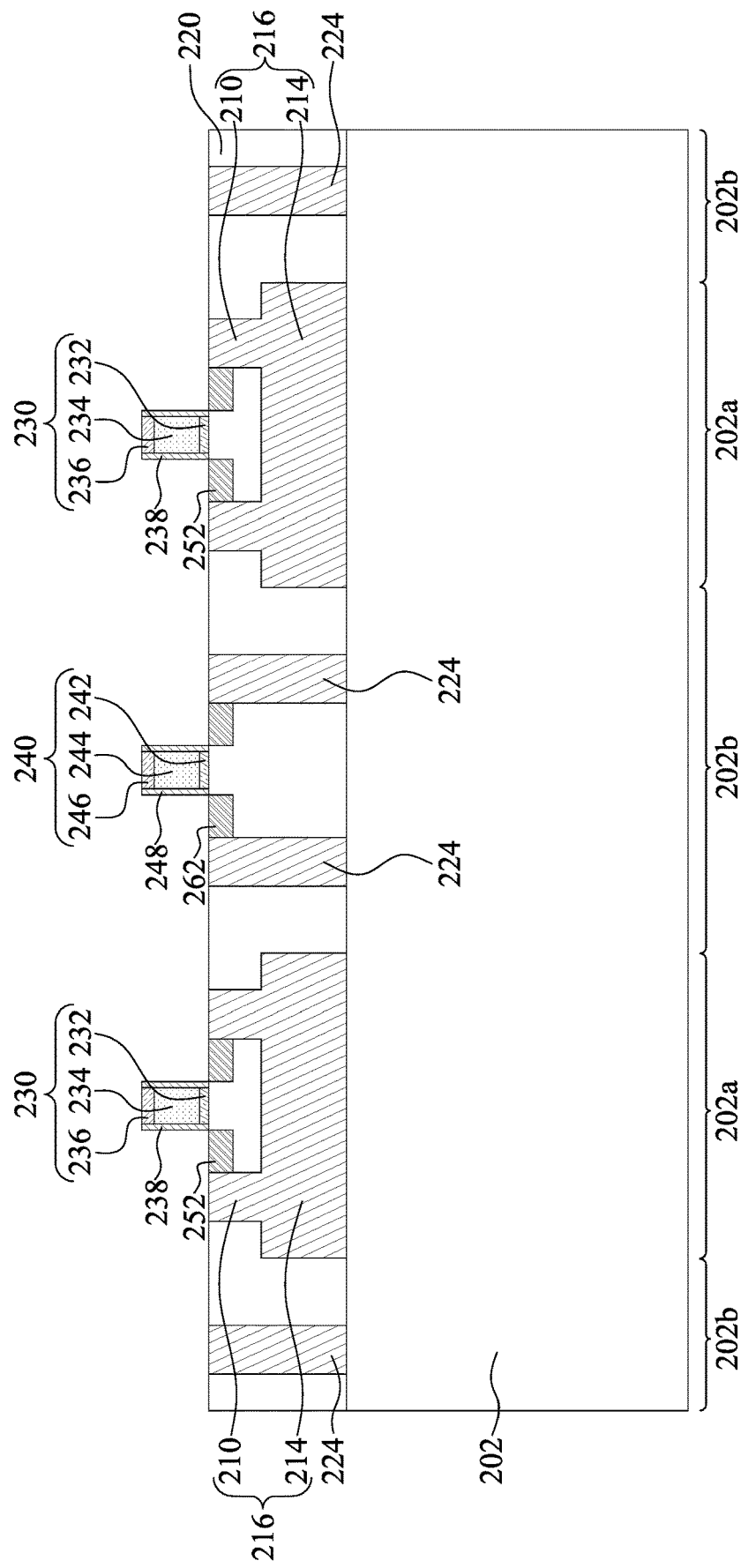
Figure 2J:
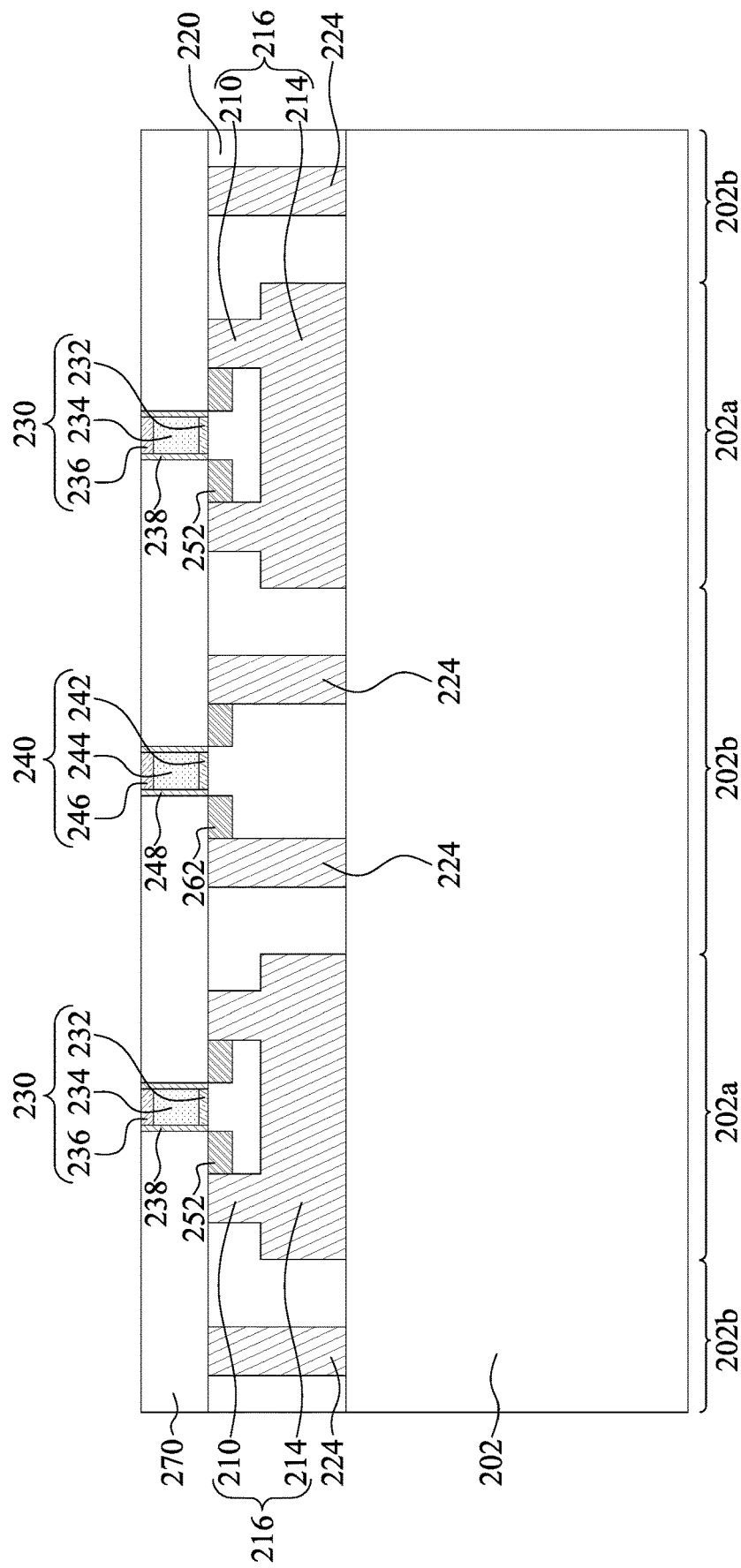
Figure 2K:
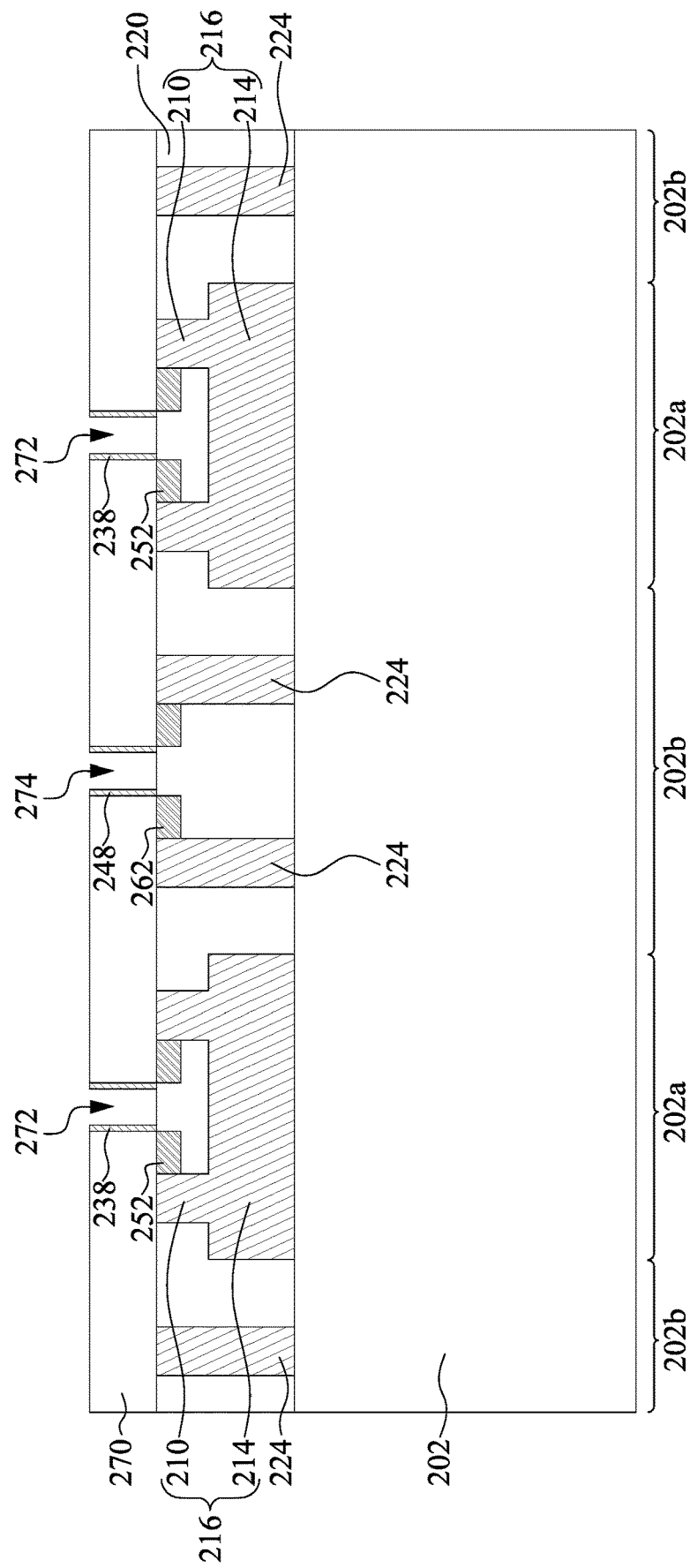
Figure 2L:
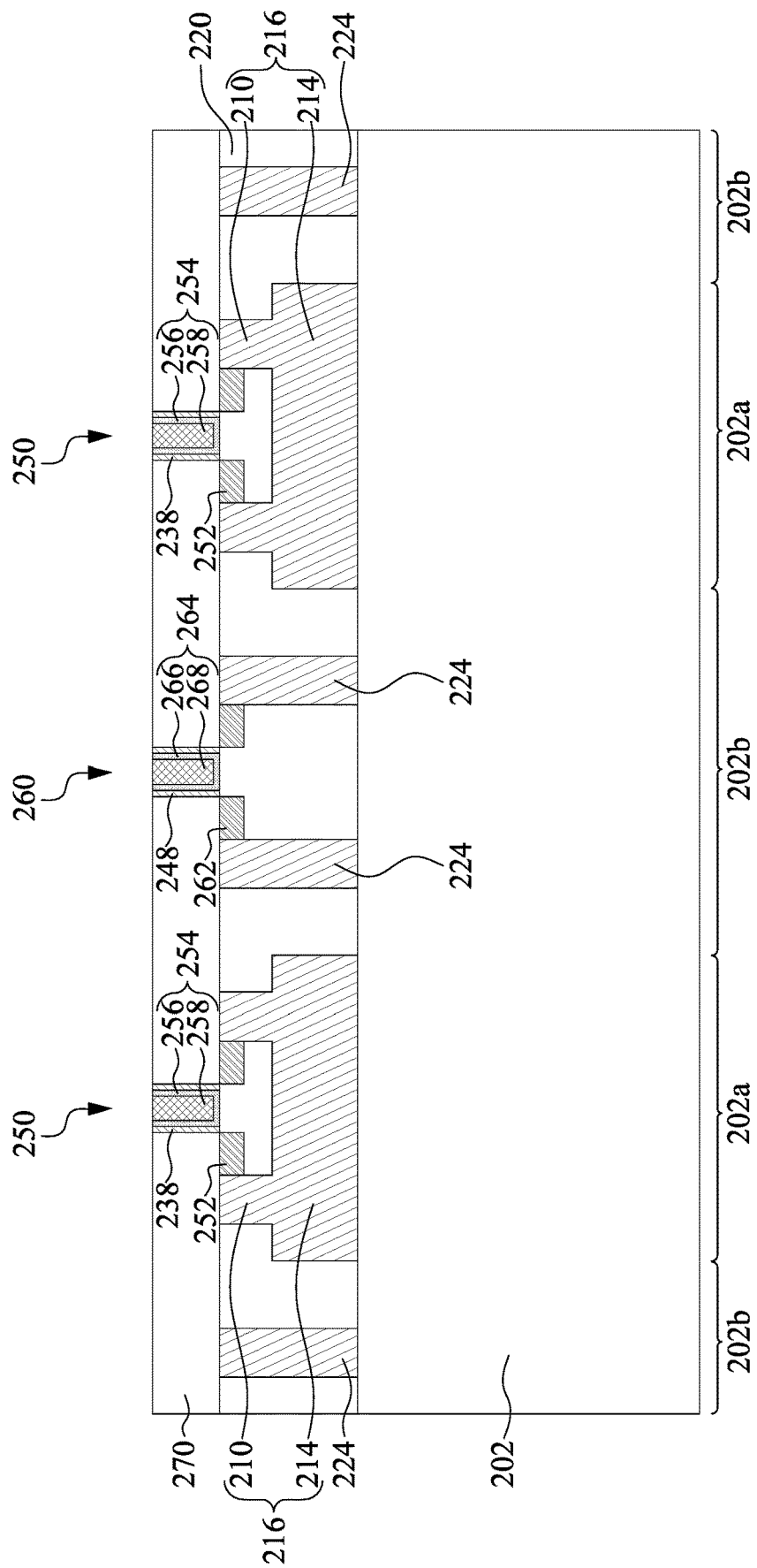
Figure 2M:
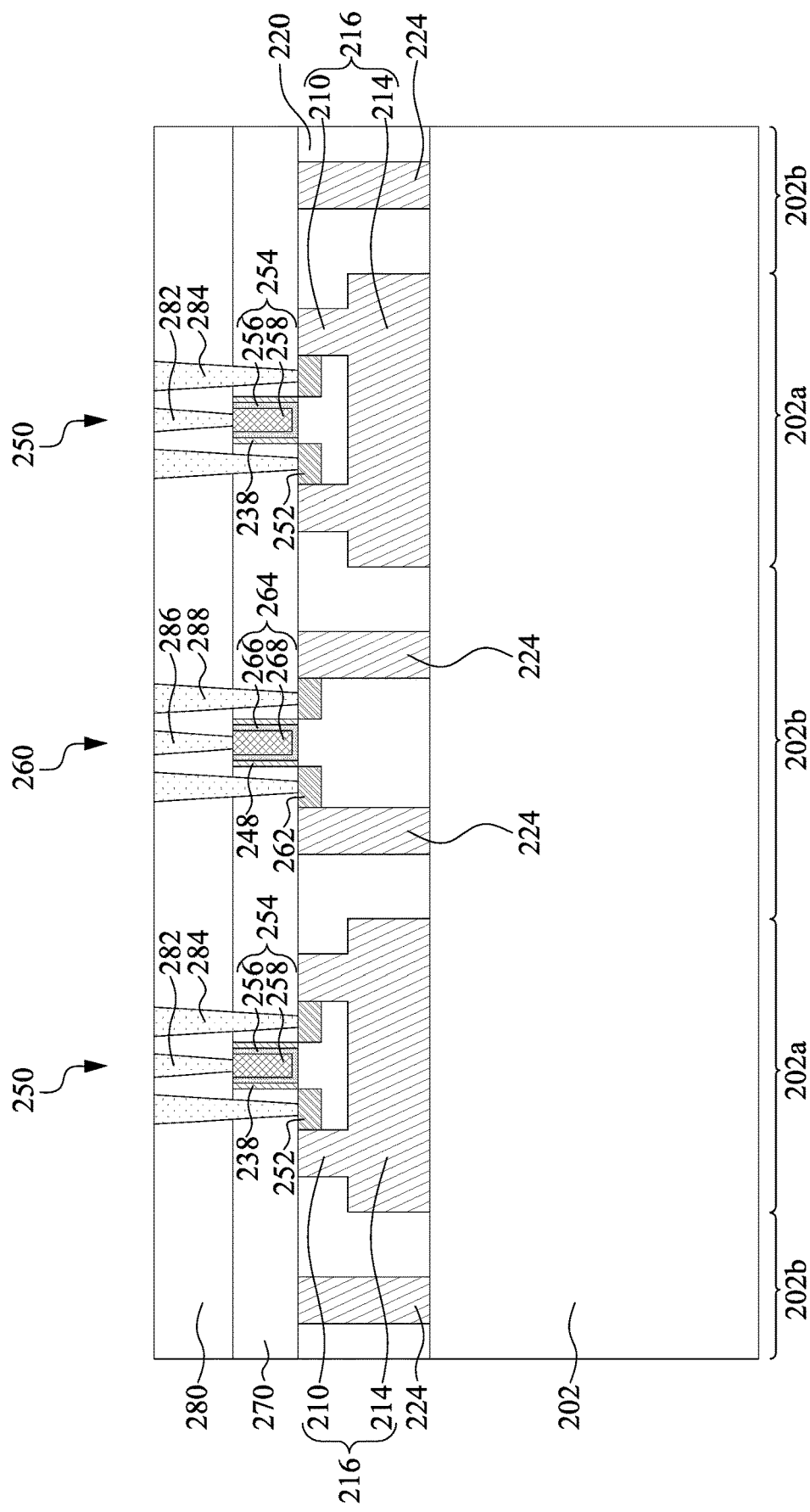
Figure 2N:
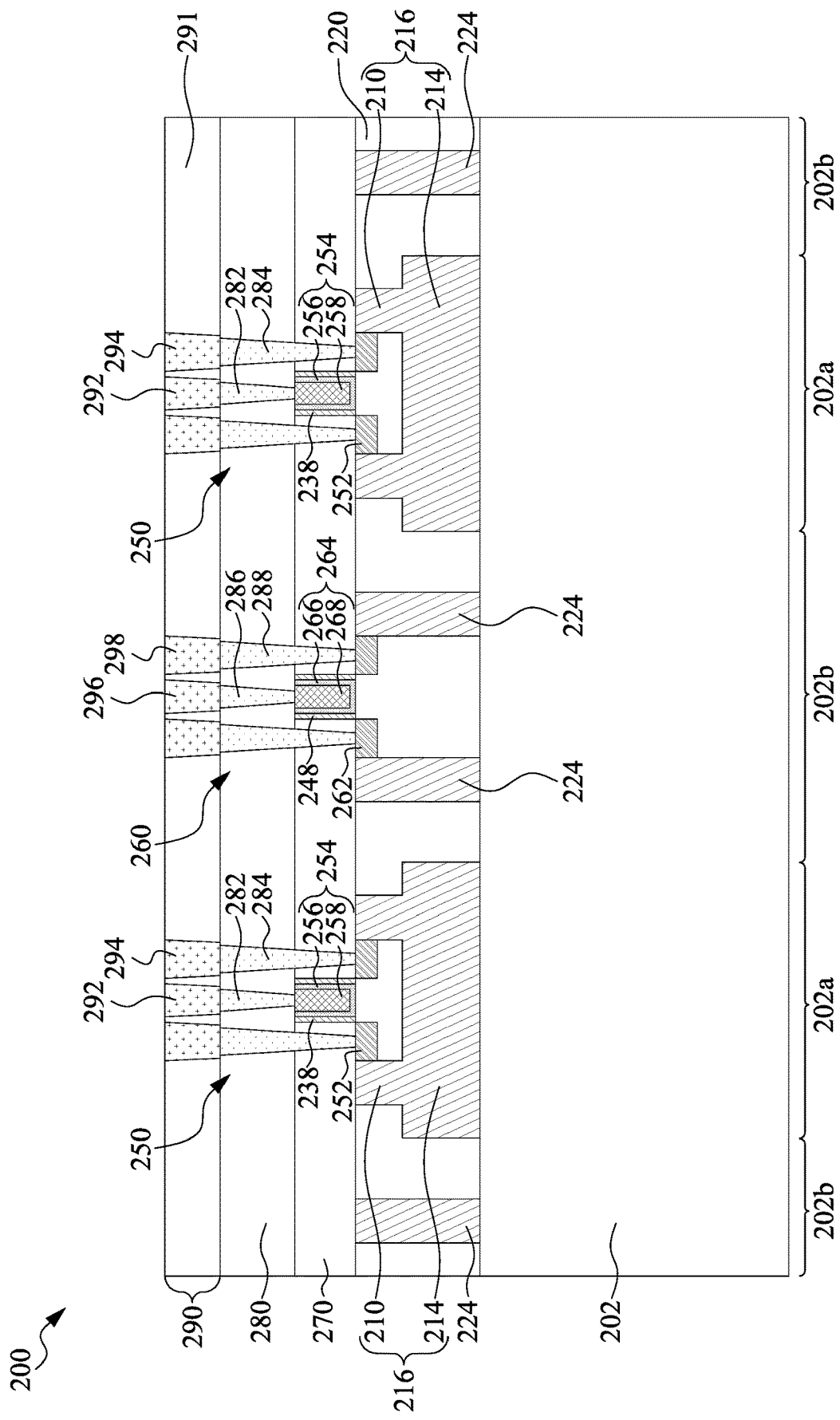

FIGS. 2A to 2N are cross-sectional views illustrating a semiconductor structure 200 at different fabrication stages constructed according to aspects of one or more embodiments of the present disclosure.

Referring to FIG. 2A, a semiconductor substrate 202 is received or formed. The respective step is shown as operation 102 of the method 100 in FIG. 1. The semiconductor substrate 202 may be a semiconductor wafer such as a silicon wafer. The semiconductor substrate 202 may include elementary semiconductor materials, compound semiconductor materials, or alloy semiconductor materials. Examples of elementary semiconductor materials may be, for example but not limited thereto, single crystal silicon, polysilicon, amorphous silicon, and/or germanium (Ge). Examples of compound semiconductor materials may be, for example but not limited thereto, silicon carbide (SiC), gallium arsenic (GaAs), gallium phosphide (GaP), indium phosphide (InP), indium arsenide (InAs), and/or indium antimonide (InSb). Examples of alloy semiconductor material may be, for example but not limited thereto, SiGe, GaAsP, AlInAs, AlGaAs, GaInAs, GaInP, and/or GaInAsP. In alternative embodiments, the semiconductor substrate 202 may be a glass substrate. In other embodiments, the semiconductor substrate 202 may be a multi-layered substrate, a gradient substrate, or a hybrid orientation substrate.

The semiconductor substrate 202 may include various device regions. In some embodiments, the semiconductor substrate 202 includes one or more first regions 202a and one or more second regions 202b. The first region 202a and the second region 202b may be used to accommodate different devices. For example, the first region 202a is a radio frequency (RF) region in which a first transistor 250 (see FIG. 2L) is to be formed. The second region 202b is a logic region in which a second transistor 260 (see FIG. 2L) is to be formed. In some embodiments, at least one of the first regions 202a is disposed between two adjacent second regions 202b. In some embodiments, at least one of the second regions 202b is disposed between two adjacent first regions 202a. The arrangement of the first regions 202a and the second regions 202b may be designed according to different product requirements.

Still Referring to FIG. 2A, a dielectric layer 204 is formed over the semiconductor substrate 202. The respective step is shown as operation 104 of the method 100 in FIG. 1. The dielectric layer 204 may include any suitable insulative materials. In some embodiments, the dielectric layer 204 may include a semiconductor oxide layer. The dielectric layer 204 may be, for example, a buried oxide (BOX) layer or a silicon oxide layer. In some embodiments, the thickness T1 of the dielectric layer 204 is substantially in a range from about 200 nanometers (nm) to about 400 nanometers.

FIGS. 2B to 2C illustrate the formation of one or more dielectric structures 216. Referring to FIGS. 2B and 2C, portions of the dielectric layer 204 (FIG. 2A) are removed to form a dielectric structure 216 in the first region 202a. The respective step is shown as operation 106 of the method 100 in FIG. 1.

Referring to FIG. 2B, the dielectric layer 204 (FIG. 2A) is etched to form one or more isolation structures 210 in the first region 202a. In some embodiments, a hard mask layer 206 is formed over the dielectric layer 204 and is then patterned through a patterned photoresist (not shown) to form openings exposing portions of the dielectric layer 204. The exposed portions of the dielectric layer 204 are etched through the openings of the patterned hard mask layer 206, forming one or more recesses 208. The remaining portions of the dielectric layer 204 may include a base portion 212 and the isolation structures 210. The etching may be performed through a dry etching process using an etching gas. The etching may also be performed through a wet etching process using an etching solution. The etching process may be adjusted to meet the requirements of the resulting transistors or devices.

The depth of the recess 208 is substantially equal to a height H1 of the isolation structure 210. The isolation structure 210 may be configured as the shallow trench isolation (STI) of the first transistor 250 (see FIG. 2L) to be formed. The height H1 and a width $W_I$ of the isolation structure 210 are selected such that the isolation structure 210 can meet the requirements for the first transistor 250 (FIG. 2L). In some embodiments, the height H1 and the width $W_I$ of the isolation structure 210 are selected such that a semiconductor layer 220 (FIG. 2D) to be formed may cover the isolation structure 210. In some embodiments, the height H1 of the isolation structure 210 is substantially in a range from about 50 nanometers (nm) to about 150 nanometers. In some embodiments, the width $W_I$ of the isolation structure 210 is substantially in a range from about 5 nanometers (nm) to about 100 nanometers. The base portion 212 may have a thickness T2. The base portion 212 may be configured as a buried oxide region of the first transistor 250 (FIG. 2L) to be formed. The thickness T2 of the base portion 212 is selected such that the base portion 212 can meet the requirements for the first transistor 250 (FIG. 2L). In some embodiments, the thickness T2 of the base portion 212 is greater than or substantially equal to the height H1 of the isolation structures 210. In some embodiments, the thickness T2 of the base portion 212 is substantially in a range from about 150 nanometers to about 350 nanometers. In some embodiments, a sum of the thickness T2 and the height H1 is substantially equal to the thickness T1.

Referring to FIG. 2C, the patterned hard mask layer 206 is then removed. The base portion 212 (FIG. 2B) of the dielectric layer 204 (FIG. 2A) in the second region 202b may also be removed to expose the semiconductor substrate 202 in the second region 202b. In some embodiments, the base portion 212 of the dielectric layer 204 in the second region 202b is removed by etching. The etching may be performed through a dry etching process using an etching gas. The etching may also be performed through a wet etching process using an etching solution. Photolithography processes may define masking elements to define the etched regions. As a result of the etching, an upper surface of the semiconductor substrate 202 in the second region 202b is exposed. The remaining portions of the dielectric layer 204 (FIG. 2A) form one or more dielectric structures 216. The dielectric structure 216 includes a base structure 214 and one or more isolation structures 210 over the base structure 214. In some embodiments, at least two isolation structures 210 are disposed over a single base structure 214. In some embodiments, a width $W_b$ of the base structure 214 is greater than the width $W_I$ of the isolation structure 210.

A spacing distance S1 is between two adjacent isolation structures 210. The spacing distance S1 is configured to define a space for forming or accommodating the first transistor 250 (FIG. 2L). The spacing distance S1 between the isolation structures 210 is selected such that the space can meet the requirements for forming the first transistor 250 (FIG. 2L). In some embodiments, the spacing distance S1 is substantially in a range from about 50 nanometers (nm) to about 150 nanometers. In some embodiments, a spacing distance S2 between a sidewall of the isolation structure 210 and a sidewall of the base structure 214 is substantially in a range from about 50 nanometers to about 150 nanometers. A spacing distance S3 is between two adjacent dielectric structures 216. The spacing distance S3 is configured to define a space for forming or accommodating the second transistor 260 (FIG. 2L). The spacing distance S3 between the dielectric structures 216 is selected such that the space can meet the requirements for forming the second transistor 260. In some embodiments, the spacing distance S3 is substantially in a range from about 50 nanometers to about 150 nanometers. In some embodiments, the width $W_b$ of the base structure 214 is substantially equal to a sum of the spacing distance S1, two times the spacing distances S2 and two times the width $W_I$. The spacing distances S1, S2 and S3 may be designed according to different requirements for different semiconductor devices.

Referring to FIG. 2D, a semiconductor layer 220 is formed. The respective step is shown as operation 108 of the method 100 in FIG. 1. In some embodiments, a semiconductor layer 220 is formed to cover the first region 202a and the second region 202b. In some embodiments, the semiconductor layer 220 is formed on the exposed surface of the semiconductor substrate 202 by an epitaxial growth process. In some embodiments, the epitaxial growth process includes using a silane-based precursor gas providing silicon deposition. The epitaxial growth may occur on the exposed surface of the semiconductor substrate 202. In some embodiments, the semiconductor layer 220 is grown to a thickness T3 greater than the thickness T2 of the base structure 214. In some embodiments, the thickness T3 is greater than a sum of the thickness T2 of the base structure 214 and the height H1 of the isolation structure 210.

A portion of the semiconductor layer 220 having a thickness greater than a sum of the thickness T2 and the height H1 may be regarded as an overfill portion 222 of the semiconductor layer 220. The epitaxial growth of the semiconductor layer 220 may proceed laterally from the overfill portion 222 of the semiconductor layer 220 and extend over the exposed surface of the dielectric structure 216. In other words, the forming of the semiconductor layer 220 includes laterally growing the semiconductor layer 220 on an upper surface of the dielectric structure 216. In some embodiments, the semiconductor layer 220 includes a same material as the semiconductor substrate 202 and has a same crystallographic orientation. In some embodiments, the semiconductor layer 220 may comprise silicon, germanium, carbon, gallium arsenide, or other semiconductor material, or a combination thereof. In alternative embodiments, the semiconductor layer 220 is formed using any suitable technique, such as LPCVD, PECVD, or ALD.

Referring to FIG. 2E, a portion of the semiconductor layer 220 is removed to expose a top surface of the isolation structure 210. The respective step is shown as operation 110 of the method 100 in FIG. 1. In some embodiments, the portion of the semiconductor layer 220 is removed by a planarization operation such as a chemical mechanical polish (CMP) operation. The planarization operation is performed to remove excess portions of the semiconductor layer 220 over the top surface of the isolation structures 210, resulting in the structure shown in FIG. 2E. In some embodiments, the upper surface of the semiconductor layer 220 is substantially level with the top surfaces of the isolation structures 210. In some embodiments, the semiconductor layer 220 is reduced to a thickness T4 after the planarization operation. In some embodiments, a sum of the thickness T2 and the height H1 is substantially equal to the thickness T4.

Referring to FIG. 2F, one or more isolation structures 224 are formed in the second region 202b. The respective step is shown as operation 112 of the method 100 in FIG. 1. In some embodiments, a hard mask layer (not shown) is formed over the semiconductor layer 220 and is then patterned through a patterned photoresist (not shown) to form openings exposing portions of the semiconductor layer 220. The exposed portions of the semiconductor layer 220 are etched through the openings of the patterned hard mask layer, forming one or more trenches exposing the underlying semiconductor substrate 202. The patterned hard mask layer is then removed. The trenches are then filled with insulative material. A planarization operation is then performed to remove excess insulative material over the semiconductor layer 220, resulting in the isolation structures 224 shown in FIG. 2F. The isolation structures 224 may include any suitable insulative material. In some embodiments, the isolation structures 224 include a same material as the isolation structures 210. In some embodiments, the isolation structures 224 may include a semiconductor oxide layer.

The isolation structure 224 may be configured as the isolation region such as an shallow trench isolation (STI) of the second transistor 260 (see FIG. 2L). The isolation structure 224 has a height H2 and a width $W_{II}$. The height H2 and the width $W_{II}$ of the isolation structure 224 are selected such that the isolation structure 224 can meet the requirements for the second transistor 260 (FIG. 2L). The height H2 of the isolation structure 224 is substantially greater than the height H1 of the isolation structure 210. In some embodiments, the height H2 is substantially equal to a sum of the thickness T2 and the height H1. In some embodiments, the height H2 of the isolation structure 224 is substantially in a range from about 200 nanometers to about 400 nanometers.

The proposed method for forming the semiconductor structure provides advantages in some implementations. The proposed method for forming the semiconductor structure includes forming isolation structures of different regions in separate operations, e.g., operations 106 and 112. Furthermore, the proposed method provides a structure substantially free of interface between the isolation structures 210 and the base structure 214. Accordingly, lower manufacturing costs, better dielectric isolation and lower leakage may be achieved.

Referring to FIG. 2G, gate stacks 230 and 240 are formed in the first region 202a and the second region 202b, respectively. The gate stacks 230 and 240 may be removed in subsequent steps and replaced by their respective replacement gates. Accordingly, in some embodiments, the gate stacks 230 and 240 are sacrificial gates. The gate stack 230 includes a gate dielectric 232 and a gate electrode 234. The gate stack 240 includes a gate dielectric 242 and a gate electrode 244. The gate dielectrics 232 and 242 may be formed of silicon oxide, silicon nitride, silicon carbide, or the like. The gate electrodes 234 and 244 may include conductive layers. In some embodiments, the gate electrodes 234 and 244 may include polysilicon. The gate electrodes 234 and 244 may also be formed of other conductive materials such as metals, metal alloys, metal silicides, metal nitrides, and/or the like. In some embodiments, the gate stacks 230 and 240 further include hard masks 236 and 246, respectively. The hard masks 236 and 246 may be formed of silicon nitride, for example, while other materials such as silicon carbide, silicon oxynitride, and the like may also be used. In alternative embodiments, the hard masks 236 and 246 are not formed.

Referring to FIG. 2H, gate spacers 238 and 248 are formed on sidewalls of the gate stacks 230 and 240, respectively. In accordance with some embodiments, each of the gate spacers 238 and 248 includes a silicon oxide layer and a silicon nitride layer on the silicon oxide layer. Formation of the gate spacers 238 and 248 may include depositing blanket dielectric layers, and then performing an anisotropic etching to remove horizontal portions of the blanket dielectric layers. Available deposition methods include plasma-enhanced chemical vapor deposition (PECVD), low-pressure chemical vapor deposition (LPCVD), sub-atmospheric chemical vapor deposition (SACVD), and other deposition methods.

Referring to FIG. 2I, source regions and drain regions (collectively referred to hereinafter as source/drain regions) 252 and 262 are formed in the first region 202a and the second region 202b. The source/drain regions 252 and 262 may be formed in a single formation process, and thus have a same depth, and are formed of same materials. The source/drain regions 252 and 262 may be formed simultaneously in a single implantation process. In some embodiments, the source/drain regions 252 and 262 are of n-type, and are heavily doped, and thus are referred to as N+ regions. In some embodiments, a patterned hard mask layer (not shown) is formed over the semiconductor layer 220 of the semiconductor substrate 202 to define locations of the source/drain regions 252 and 262. The source/drain regions 252 and 262 may have edges aligned with edges of the gate spacers 238 and 248, respectively. Other methods of forming the source/drain regions 252 and 262 may also be possible including for example, forming epitaxial features.

In some embodiments, silicide regions (not shown) are formed in the first region 202a and the second region 202b, respectively. A formation process of the silicide regions may include forming a resist protective oxide (RPO) over portions of the semiconductor substrate 202 that are not protected by the gate spacers 238 and 248. The RPO may function as a silicide blocking layer during the formation of the silicide regions. The silicide regions may be formed using silicidation such as self-aligned silicide (salicide), in which a metallic material is formed over the semiconductor layer 220 of the semiconductor substrate 202, a temperature is raised to anneal the semiconductor substrate 202 and cause reaction between underlying silicon of the semiconductor layer 220 and the metal to form silicide, and un-reacted metal is etched away. The silicide regions may be formed in a self-aligned manner on various features, such as the source/drain regions 252 and 262, to reduce contact resistance.

Referring to FIG. 2J, an inter-layer dielectric (ILD) layer 270 is formed over the semiconductor substrate 202. The ILD layer 270 is blanket formed to a height higher than top surfaces of the gate stacks 230 and 240. In some embodiments, a planarization operation is performed to remove excess portions of the ILD layer 270, until the top surfaces of the gate stacks 230 and 240 are exposed. The planarization may be stopped on the hard masks 236 and 246, if they are present. Alternatively, the hard masks 236 and 246 are removed during the planarization, and the gate electrodes 234 and 244 are exposed. The ILD layer 270 may be formed of an oxide using, for example, flowable chemical vapor deposition (FCVD). The ILD layer 270 may also be a spin-on glass formed using spin-on coating. For example, the ILD layer 270 may be formed of phospho-silicate glass (PSG), boro-silicate glass (BSG), boron-doped phospho-silicate glass (BPSG), tetraethyl orthosilicate (TEOS) oxide, TiN, SiOC, or other low-k dielectric materials.

FIGS. 2K and 2L illustrate formation of replacement gate stacks 254 and 264 in accordance with some embodiments. Referring to FIG. 2K, the gate stacks 230 and 240 (FIG. 2J) are removed. In some embodiments, the gate stacks 230 and 240 are removed to form gate trenches 272 and 274 in the ILD layer 270, respectively. In some embodiments, a dry etching operation is performed to remove the gate stacks 230 and 240. In some embodiments, the dry etching operation uses F-containing plasma, Cl-containing plasma and/or Br-containing plasma to remove the gate stacks 230 and 240.

It should be understood that the semiconductor substrate 202 may include various device regions, and the various device regions may include various n-type or p-type FET devices and one or more passive devices such as a resistor. It should be also understood that different devices may require different types of elements. In some embodiments, when an I/O FET device is used, the gate dielectrics 232 and 242 (FIG. 2J) can respectively serve as an interfacial layer (IL). Thus, the gate dielectrics 232 and 242 may be left in place. In alternative embodiments, when a core FET device is used, the gate dielectrics 232 and 242 are removed to thereby expose the semiconductor layer 220 to the gate trenches 272 and 274, respectively.

Referring to FIG. 2L, the gate stacks 230 and 240 (FIG. 2J) are replaced by replacement gate stacks 254 and 264, respectively. The gate stack 254 includes a gate dielectric 256 and a gate electrode 258. The gate stack 264 includes a gate dielectric 266 and a gate electrode 268. The gate dielectrics 256 and 266 may include a high-k dielectric material such as hafnium oxide, lanthanum oxide, aluminum oxide, or the like. In addition, the gate dielectrics 256 and 266 may be formed in a single formation process, and thus have same thicknesses, and are formed of same dielectric materials.

The gate electrodes 258 and 268 may include conductive layers. In some embodiments, the gate electrodes 258 and 268 may include at least a barrier metal layer, a work function metal layer and a gap-filling metal layer. The barrier metal layer may include, for example but not limited thereto, TiN. The work function metal layer may include a single layer of TiN, TaN, TaAlC, TiC, TaC, Co, Al, TiAl, HfTi, TiSi, TaSi or TiAlC, or a multilayer of two or more of these materials, but is not limited to such materials. In some embodiments, the gap-filling metal layer includes a conductive material such as Al, Cu, AlCu or W, but is not limited thereto. Formation methods of the gate electrodes 258 and 268 include physical vapor deposition (PVD), chemical vapor deposition (CVD), or the like. In addition, the gate electrodes 258 and 268 may be formed in a single formation process and are formed of same materials. A planarization operation (for example, a CMP) is then performed to remove excess portions of the gate dielectrics 256 and 266 and gate electrodes 258 and 268, leaving the structure shown in FIG. 2L.

Based on the operations described with reference to FIGS. 2G to 2L, one or more first transistors 250 and one or more second transistors 260 are thus formed. The first transistor 250 includes the gate electrode 258, the gate dielectric 256, and the source/drain regions 252. The second transistor 260 includes the gate electrode 268, the gate dielectric 266, and the source/drain regions 262. In accordance with some embodiments, the first transistor 250 is an RF device, while the second transistor 260 is a logic device. In some embodiments, the first transistor 250 is a partially depleted transistor. In some embodiments, the first transistor 250 and the second transistor 260 are separated from each other by the isolation structures 210 and 224. In some embodiments, the first transistor 250 and the second transistor 260 are separated from each other by the isolation structures 210, 224 and the semiconductor layer 220 between the isolation structures 210 and 224.

FIG. 2M illustrates the formation of a dielectric layer 280 over the replacement gate stacks 254 and 264. The dielectric layer 280 may be formed of a material selected from the same candidate materials considered for forming the ILD layer 270. The ILD layer 270 and the dielectric layer 280 may be formed of same or different materials.

Referring to FIG. 2M, contact plugs 282, 284, 286 and 288 are formed in the dielectric layer 280 and the ILD layer 270. The formation process may include forming contact plug openings in the ILD layer 270 and the dielectric layer 280 to expose the source/drain regions 252 and 262 and the gate electrodes 256 and 266, and filling the contact plug openings to form the contact plugs 282, 284, 286 and 288. In some embodiments, at least one of the contact plugs 282 landing on the gate electrode 256 is referred to as a gate via of the first transistor 250. The contact plugs 284 landing on the source/drain regions 252 may be referred to as source/drain vias of the first transistor 250. In some embodiments, at least one of the contact plugs 286 landing on the gate electrode 266 is referred to as a gate via of the second transistor 260. The contact plugs 288 landing on the source/drain regions 262 may be referred to as source/drain vias of the second transistor 260.

Referring to FIG. 2N, an interconnect structure 290 is arranged over the dielectric layer 280. The interconnect structure 290 may comprise one or more inter-metal dielectric (IMD) layers 291. The IMD layer 291 may comprise, for example, one or more layers of an oxide, a low-k dielectric, or an ultra-low-k dielectric. The IMD layer 291 may surround one or more metal wires (or metal vias) 292, 294, 296 and 298 that comprise, for example, copper, tungsten, and/or aluminum. The contact plug 282 may be configured to electrically couple the gate electrode 256 of the first transistor 250 to the metal wire 292 of the interconnect structure 290. In some embodiments, the contact plug 284 is configured to electrically couple the source/drain regions 252 of the first transistor 250 to the metal wire 294 of the interconnect structure 290. The contact plug 286 may be configured to electrically couple the gate electrode 266 of the second transistor 260 to the metal wire 296 of the interconnect structure 290. In some embodiments, the contact plug 288 is configured to electrically couple the source/drain regions 262 of the second transistor 260 to the metal wire 298 of the interconnect structure 290.

The structures of the present disclosure are not limited to the above-mentioned embodiments and may have other different embodiments. To simplify the description and for convenience of comparison between each of the embodiments of the present disclosure, identical (or like) components in each of the following embodiments are marked with identical (or like) numerals. For making it easier to compare differences between the embodiments, the following description will detail dissimilarities among different embodiments, while identical features, values and definitions will not be repeated.

Figure 3B:
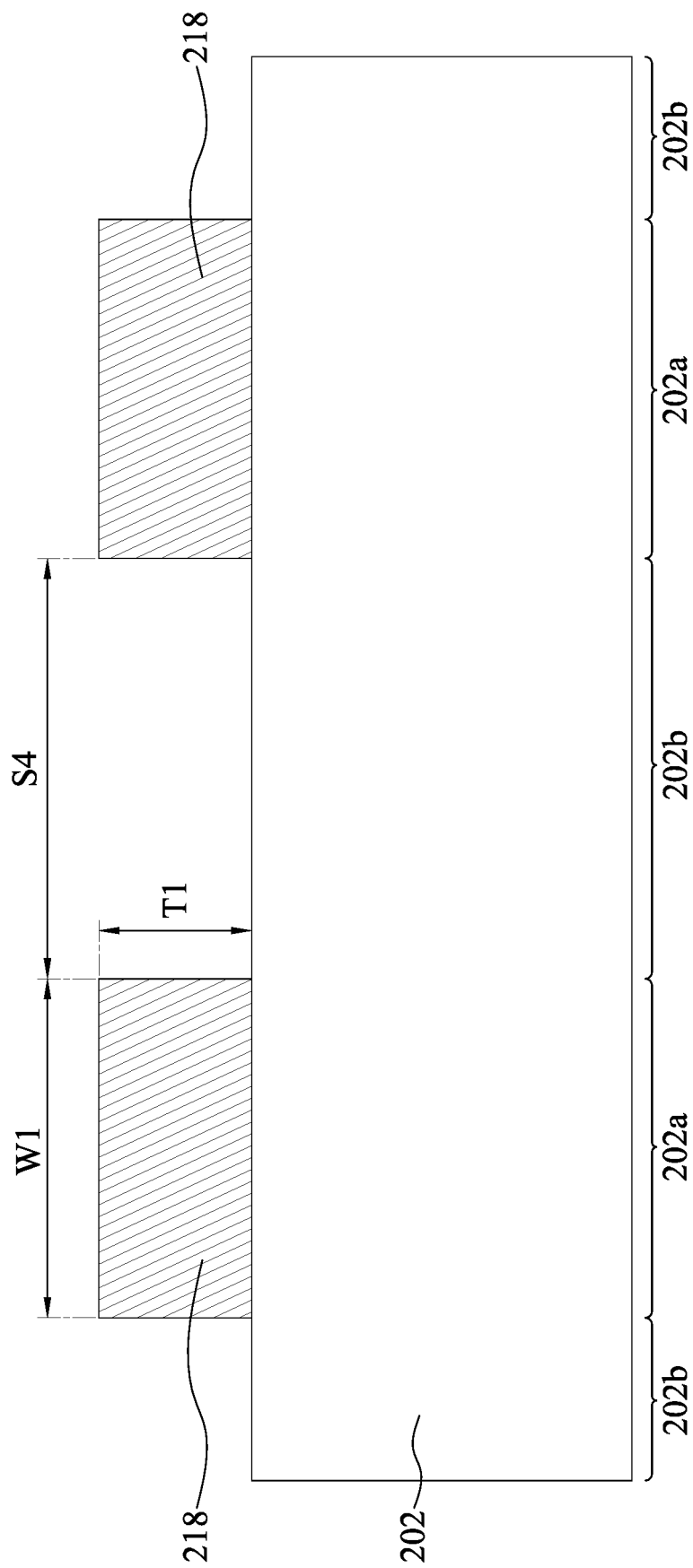
Figure 3C:
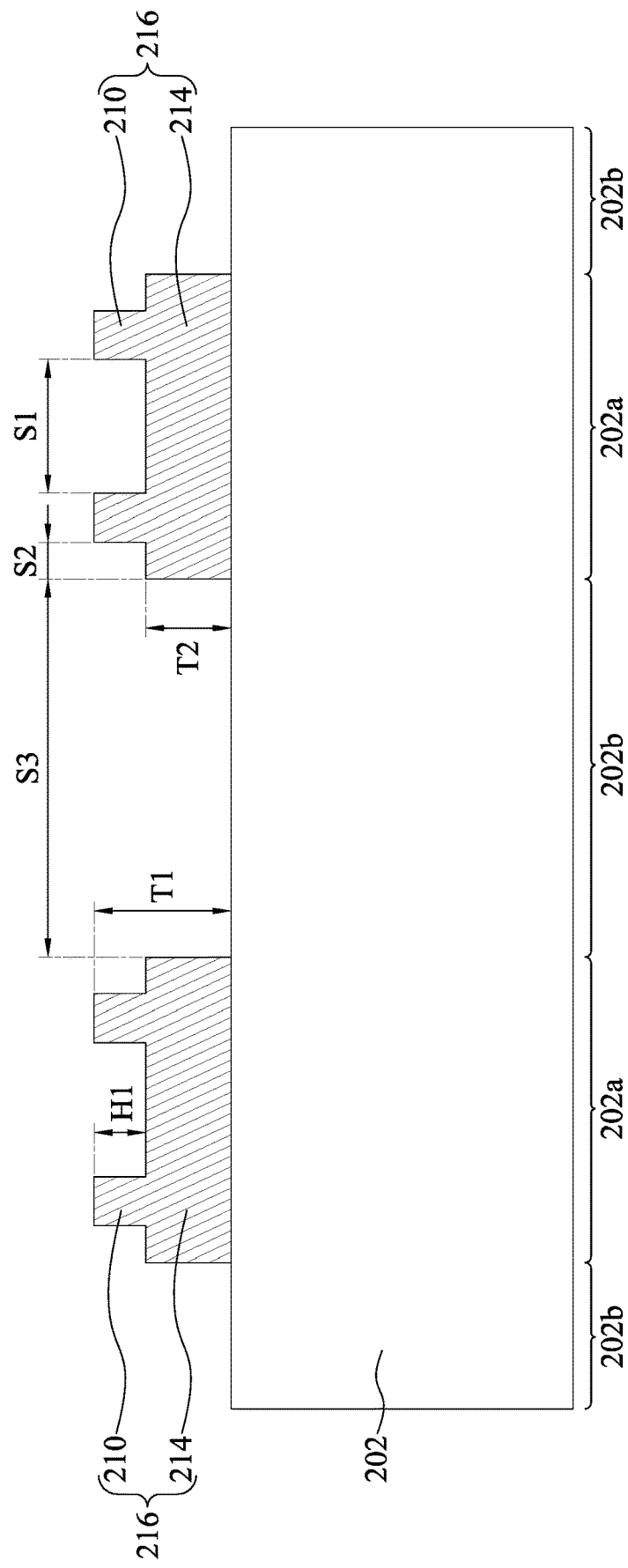

FIGS. 3A to 3C are cross-sectional views illustrating the semiconductor structure 200 at different fabrication stages constructed according to aspects of one or more embodiments of the present disclosure. FIGS. 3A to 3C illustrate an alternative approach to obtaining the dielectric structures 216.

Referring to FIG. 3A, the semiconductor substrate 202 is received or formed. Furthermore, the dielectric layer 204 is formed over the semiconductor substrate 202.

Referring to FIG. 3B, the dielectric layer 204 (FIG. 3A) in the second region 202b is removed. In some embodiments, the dielectric layer 204 in the second region 202b is removed by etching. The etching may be performed through a dry etching process using an etching gas. The etching may also be performed through a wet etching process using an etching solution. As a result of the etching, an upper surface of the semiconductor substrate 202 in the second region 202b is exposed. The remaining portions of the dielectric layer 204 form one or more dielectric structures 218. The dielectric structure 218 may have a thickness T1 and a width W1. The width W1 is configured to define a space for forming or accommodating the first transistor 250 (FIG. 2L). The width W1 is selected such that the space can meet the requirements for forming the first transistor 250. In some embodiments, the width W1 is substantially in a range from about 100 nanometers to about 500 nanometers. A spacing distance S4 is between two adjacent dielectric structures 218. The spacing distance S4 is configured to define a space for forming or accommodating the second transistor 260 (FIG. 2L). The spacing distance S4 between the dielectric structures 218 is selected such that the space can meet the requirements for forming the second transistor 260. In some embodiments, a spacing distance S4 between two adjacent dielectric structures 218 is substantially in a range from about 50 nanometers to about 150 nanometers.

Referring to FIG. 3C, the dielectric structures 218 (FIG. 3B) are etched to form one or more isolation structures 210 in the first region 202a. In some embodiments, a hard mask layer (not shown) is formed over the dielectric structure 218 and is then patterned through a patterned photoresist (not shown) to form openings exposing portions of the dielectric structure 218. The exposed portions of the dielectric structure 218 are etched through the openings of the patterned hard mask layer. The patterned hard mask layer is then removed. The remaining portion of the dielectric structure 218 forms the dielectric structure 216, which may include the base structure 214 and the isolation structures 210. In some embodiments, the spacing distance S4 between two adjacent dielectric structures 218 (FIG. 3B) is substantially equal to a spacing distance S3 between two adjacent dielectric structures 216.

FIGS. 4A to 4F are cross-sectional views illustrating a semiconductor structure 300 at different fabrication stages constructed according to aspects of one or more embodiments of the present disclosure.

Figure 4A:
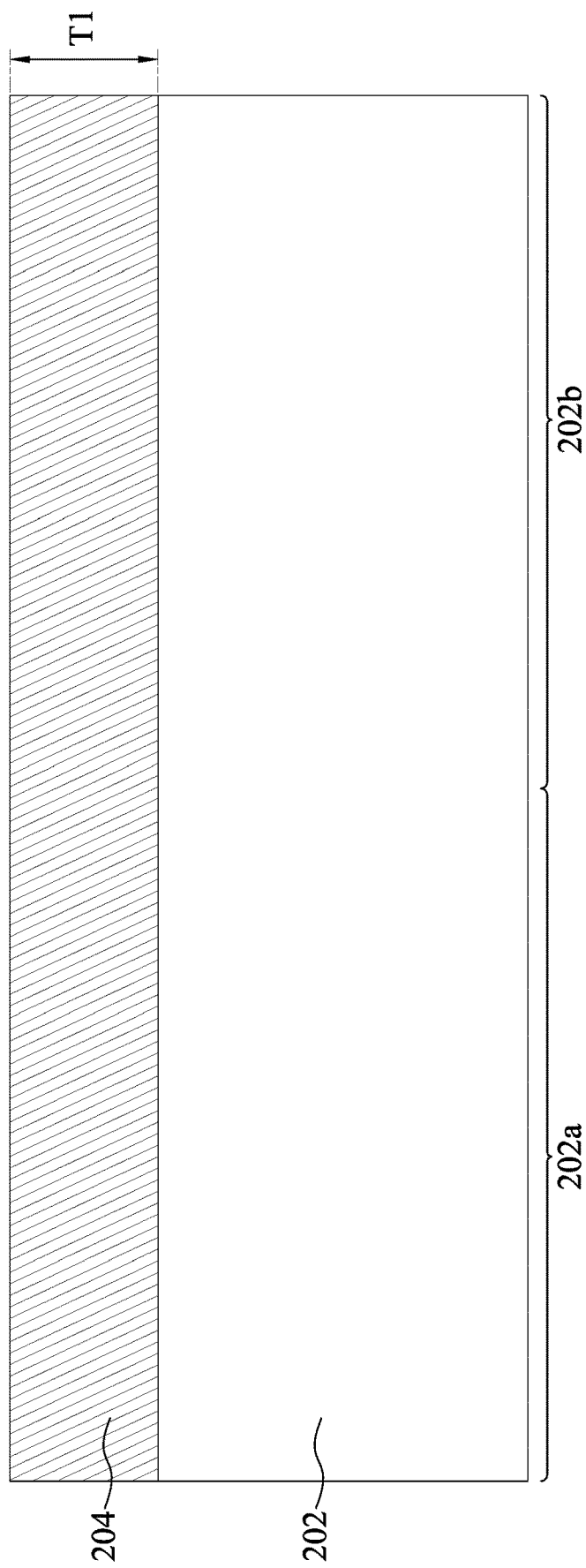
FIGS. 4A to 4F are cross-sectional views illustrating a semiconductor structure 300 at different fabrication stages constructed according to aspects of one or more embodiments of the present disclosure.

Referring to FIG. 4A, a semiconductor substrate 202 is received or formed. The respective step is shown as operation 102 of the method 100 in FIG. 1. The semiconductor substrate 202 may include various device regions. In some embodiments, the semiconductor substrate 202 includes one or more first regions 202a and one or more second regions 202b. The first region 202a and the second region 202b may include different devices. For example, the first region 202a is a radio frequency (RF) region in which a first transistor 250 (see FIG. 4F) is to be formed. The second region 202b is a logic region in which a second transistor 260 (see FIG. 4F) is to be formed. In some embodiments, one or more first transistors 250 are disposed in the first region 202a and one or more second transistors 260 are disposed in the second region 202b. In some embodiments, the first region 202a is laterally surrounded by the second region 202b.

Still referring to FIG. 4A, a dielectric layer 204 is formed over the semiconductor substrate 202. The respective step is shown as operation 104 of the method 100 in FIG. 1. The dielectric layer 204 may include any suitable insulative materials.

Figure 4B:
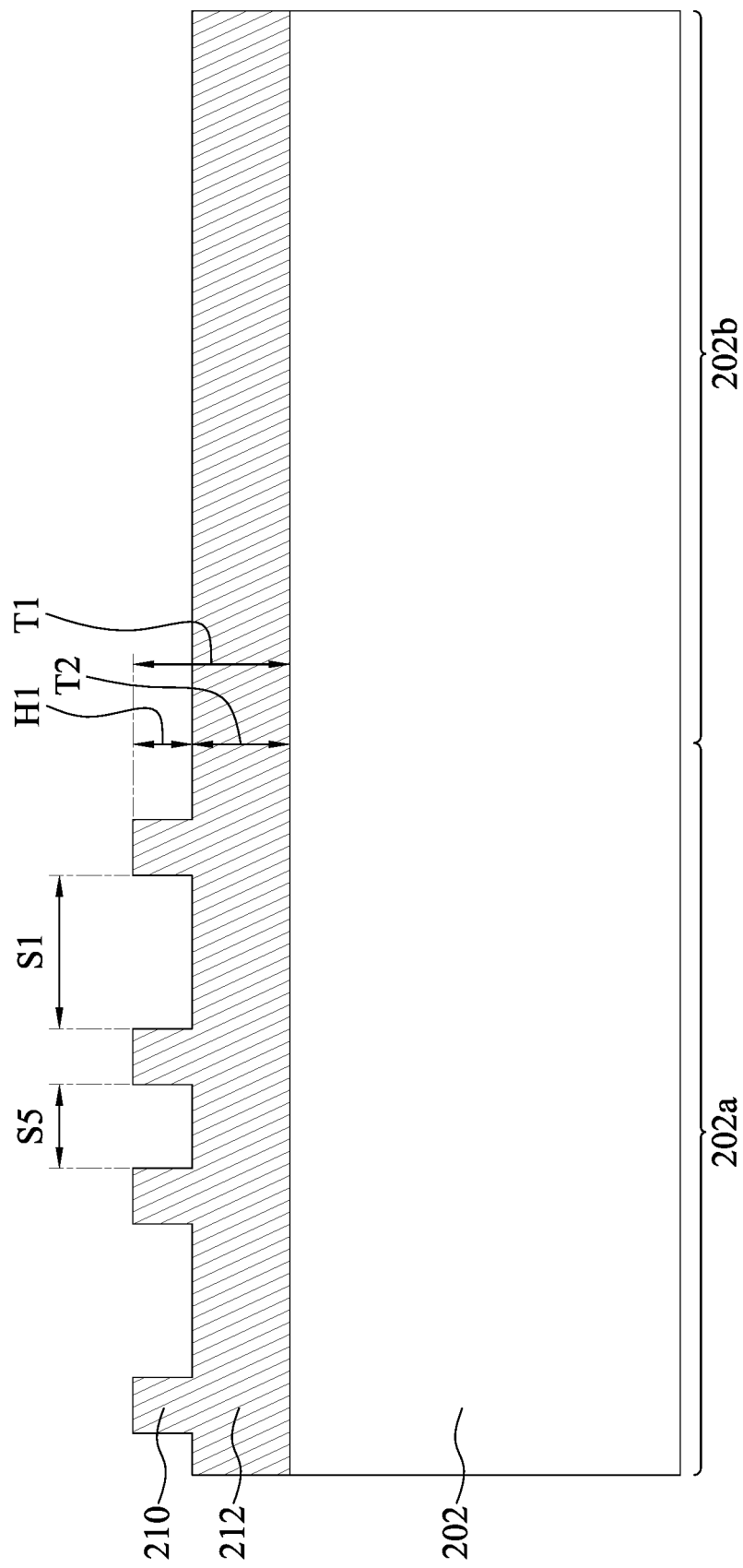
Figure 4C:
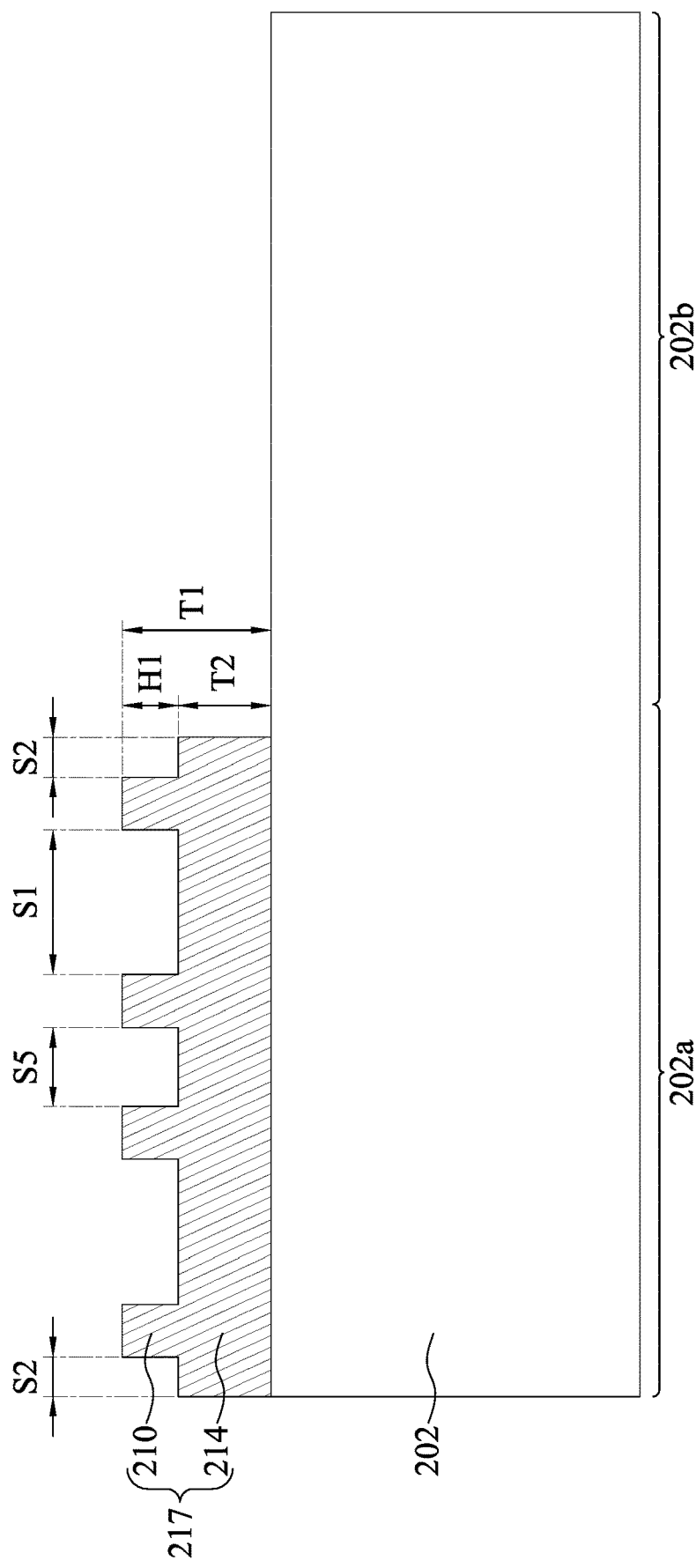

FIGS. 4B to 4C illustrate formation of one or more dielectric structures 217. Referring to FIGS. 4B and 4C, portions of the dielectric layer 204 are removed to form a dielectric structure 217 in the first region 202a. The respective step is shown as operation 106 of the method 100 in FIG. 1.

Referring to FIG. 4B, the dielectric layer 204 (FIG. 4A) is etched to form one or more isolation structures 210 in the first region 202a. In some embodiments, a hard mask layer (not shown) is formed over the dielectric layer 204 and is then patterned through a patterned photoresist (not shown) to form openings exposing portions of the dielectric layer 204. The exposed portions of the dielectric layer 204 are etched through the openings of the patterned hard mask layer. The patterned hard mask layer is then removed. Remaining portions of the dielectric layer 204 may include a base portion 212 and the isolation structures 210. A height H1 of the isolation structure 210 and/or a thickness T2 of the base portion 212 are selected such that they can meet requirements of the first transistor 250 to be formed.

Referring to FIG. 4C, the base portion 212 (FIG. 4B) of the dielectric layer 204 (FIG. 4A) in the second region 202b is removed to expose the semiconductor substrate 202 in the second region 202b. In some embodiments, the base portion 212 of the dielectric layer 204 in the second region 202b is removed by etching. As a result of the etching, an upper surface of the semiconductor substrate 202 in the second region 202b is exposed. Remaining portions of the dielectric layer 204 (FIG. 4A) form one or more dielectric structures 217. The dielectric structure 217 includes a base structure 214 and one or more isolation structures 210 over the base structure 214. In some embodiments, a spacing distance S1 between two adjacent isolation structures 210 is substantially in a range from about 50 nanometers to about 150 nanometers. In some embodiments, a spacing distance S2 between a sidewall of the isolation structure 210 and a sidewall of the base structure 214 is substantially in a range from about 50 nanometers to about 150 nanometers. A spacing distance S5 is between two adjacent isolation structures 210 (of two adjacent first transistors 250, see FIG. 4F). The spacing distance S5 between two adjacent isolation structures 210 of two adjacent first transistors 250 may be selected such that the two adjacent first transistors 250 may not interfere with each other. In some embodiments, the spacing distance S5 is substantially in a range from about 50 nanometers to about 150 nanometers. The spacing distances S1, S2 and S5 may be designed according to different requirements for different semiconductor devices.

Figure 4D:
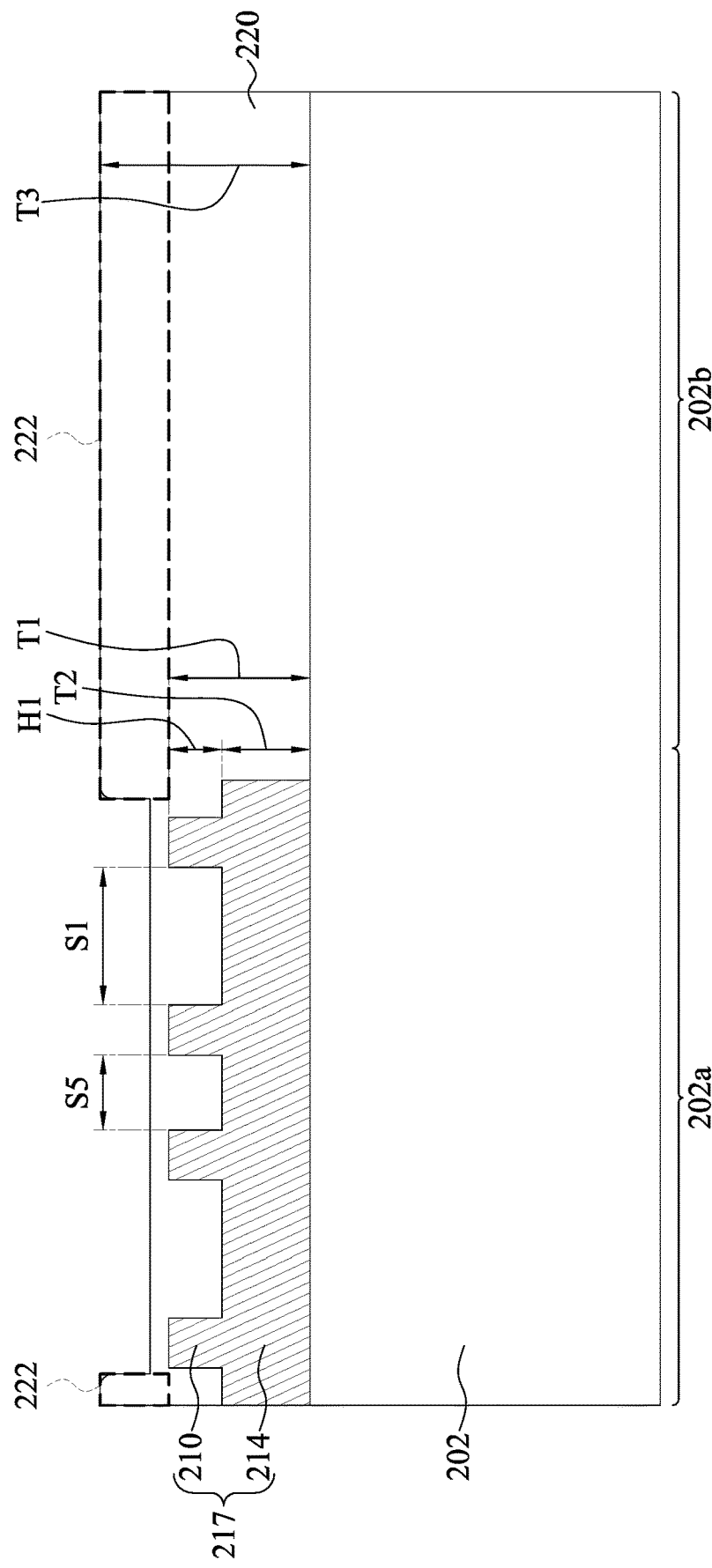

Referring to FIG. 4D, a semiconductor layer 220 is formed. The respective step is shown as operation 108 of the method 100 in FIG. 1. In some embodiments, a semiconductor layer 220 is formed to cover the first region 202a and the second region 202b. In some embodiments, the semiconductor layer 220 is formed on the exposed upper surface of the semiconductor substrate 202 by an epitaxial growth process. The epitaxial growth may occur on the exposed upper surface of the semiconductor substrate 202. In some embodiments, the semiconductor layer 220 is grown to a thickness T3 greater than the thickness T2 of the base structure 214. In some embodiments, the thickness T3 is greater than a sum of the thickness T2 of the base structure 214 and the height H1 of the isolation structure 210.

A portion of the semiconductor layer 220 having a thickness greater than a sum of the thickness T2 and the height H1 may be regarded as an overfill portion 222 of the semiconductor layer 220. The epitaxial growth of the semiconductor layer 220 may proceed laterally from the overfill portion 222 of the semiconductor layer 220 and extend over the exposed surface of the dielectric structure 217. In other words, the forming of the semiconductor layer 220 includes laterally growing the semiconductor layer 220 on an upper surface of the dielectric structure 217.

Figure 4E:
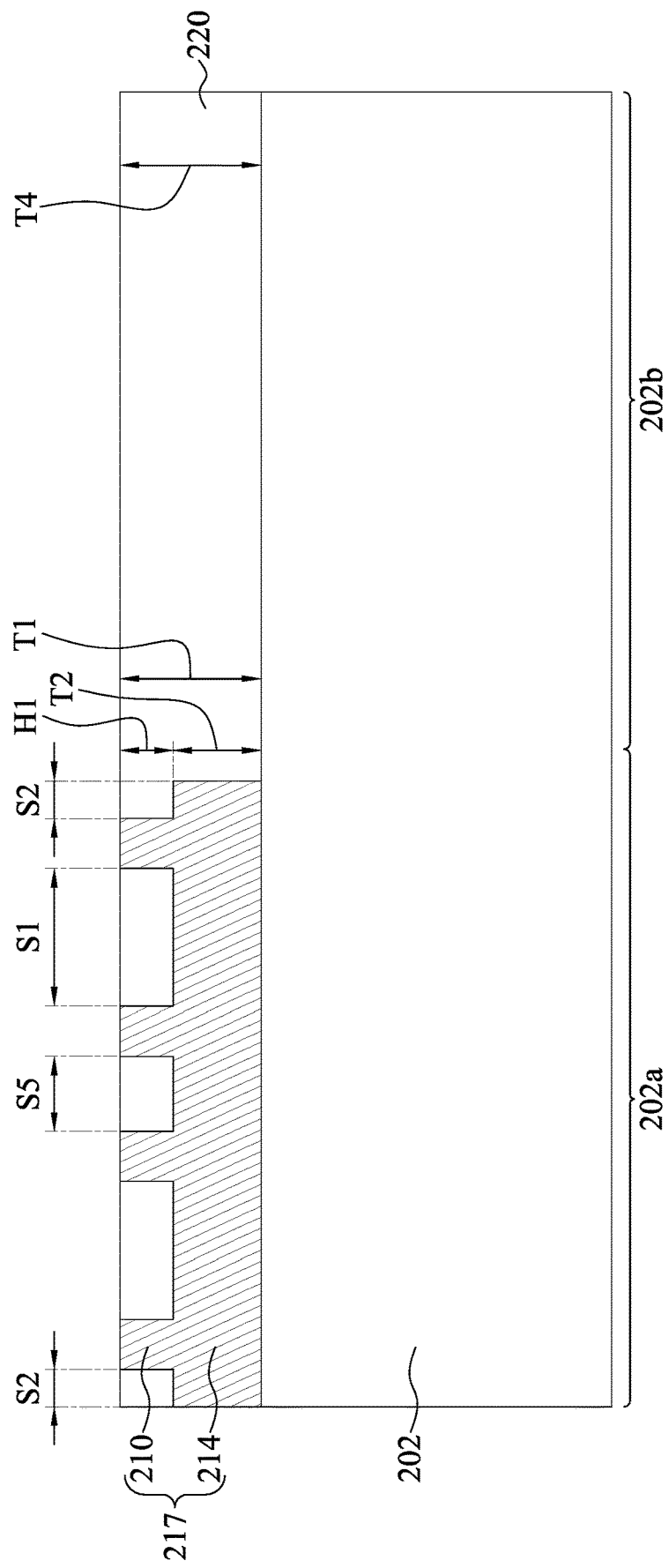

Referring to FIG. 4E, a portion of the semiconductor layer 220 is removed to expose a top surface of the isolation structure 210. The respective step is shown as operation 110 of the method 100 in FIG. 1. In some embodiments, the portion of the semiconductor layer 220 is removed by a planarization operation such as a chemical mechanical polish (CMP) operation. The planarization operation is performed to remove excess portions of the semiconductor layer 220 over the top surface of the isolation structures 210, resulting in the structure shown in FIG. 4E. In some embodiments, the semiconductor layer 220 is reduced to a thickness T4 after the planarization operation. In some embodiments, a sum of the thickness T2 and the height H1 is substantially equal to the thickness T4.

Figure 4F:
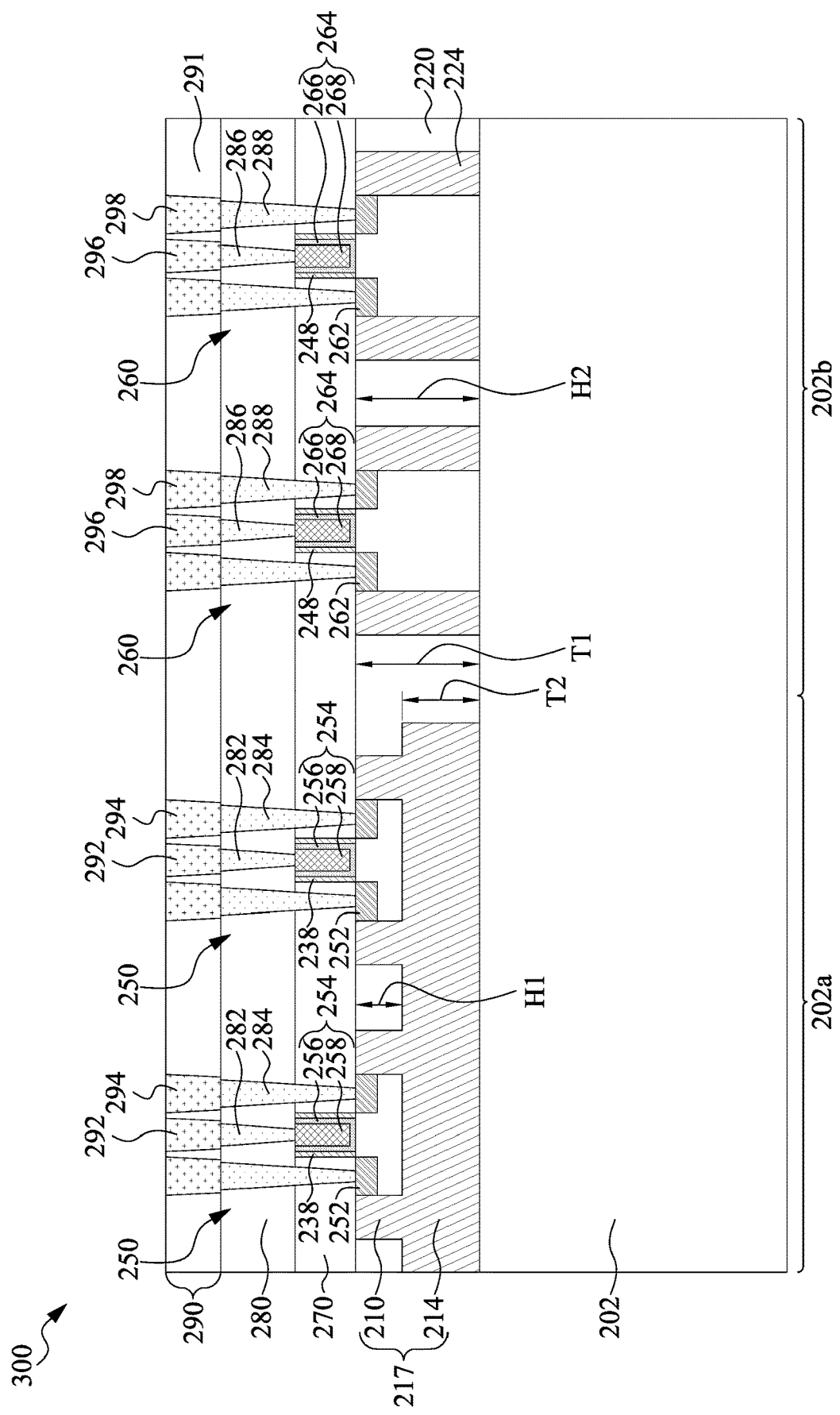

Referring to FIG. 4F, one or more isolation structures 224 are formed in the second region 202b. The respective step is shown as operation 112 of the method 100 in FIG. 1. In some embodiments, a hard mask layer (not shown) is formed over the semiconductor layer 220 and is then patterned through a patterned photoresist (not shown) to form openings exposing portions of the semiconductor layer 220. The exposed portions of the semiconductor layer 220 are etched through the openings of the patterned hard mask layer, forming one or more trenches exposing the underlying semiconductor substrate 202. The patterned hard mask layer is then removed. The trenches are then filled with insulative material. A planarization operation is then performed to remove excess insulative material over the semiconductor layer 220, resulting in the isolation structures 224 shown in FIG. 4F. The isolation structures 224 may include any suitable insulative material. In some embodiments, the isolation structures 224 include a same material as the isolation structures 210. The isolation structure 224 has a height H2 substantially greater than the height H1 of the isolation structure 210. In some embodiments, the height H2 is substantially equal to a sum of the thickness T2 and the height H1. In some embodiments, the height H2 of the isolation structure 224 is substantially in a range from about 200 nanometers to about 400 nanometers.

The proposed method for forming the semiconductor structure provides advantages. The proposed method includes forming isolation structures of different regions in separate operations, e.g., operations 106 and 112. Furthermore, the proposed method provides a structure substantially free of interface between the isolation structures 210 and the base structure 214. Accordingly, lower manufacturing costs, better dielectric isolation and lower leakage may be achieved.

Still referring to FIG. 4F, operations similar to those described with reference to FIGS. 2G to 2L can be repeated for forming one or more first transistors 250 and one or more second transistors 260. The first transistor 250 includes the gate electrode 258, the gate dielectric 256, and the source/drain regions 252. The second transistor 260 includes the gate electrode 268, the gate dielectric 266, and the source/drain regions 262. In some embodiments, the first transistor 250 is an RF device, while the second transistor 260 is a logic device. In some embodiments, the first transistor 250 is a partially depleted transistor. In some embodiments, the first transistor 250 and the second transistor 260 are separated from each other by the isolation structures 210 and 224. In some embodiments, the first transistor 250 and the second transistor 260 are separated from each other by the isolation structures 210, 224 and the semiconductor layer 220 between the isolation structures 210 and 224.

Alternatively or additionally, operations similar to those described above with reference to FIGS. 2M to 2N can be repeated for forming an ILD layer 270 and a dielectric layer 280 over the first and second transistors 250 and 260. Furthermore, contact plugs 282, 284, 286 and 288 are formed in the dielectric layer 280 and the ILD layer 270. An interconnect structure 290 can be arranged over the dielectric layer 280. The interconnect structure 290 may comprise one or more inter-metal dielectric (IMD) layers 291. The IMD layer 291 may surround one or more metal wires (or metal vias) 292, 294, 296 and 298.

Figure 5A:
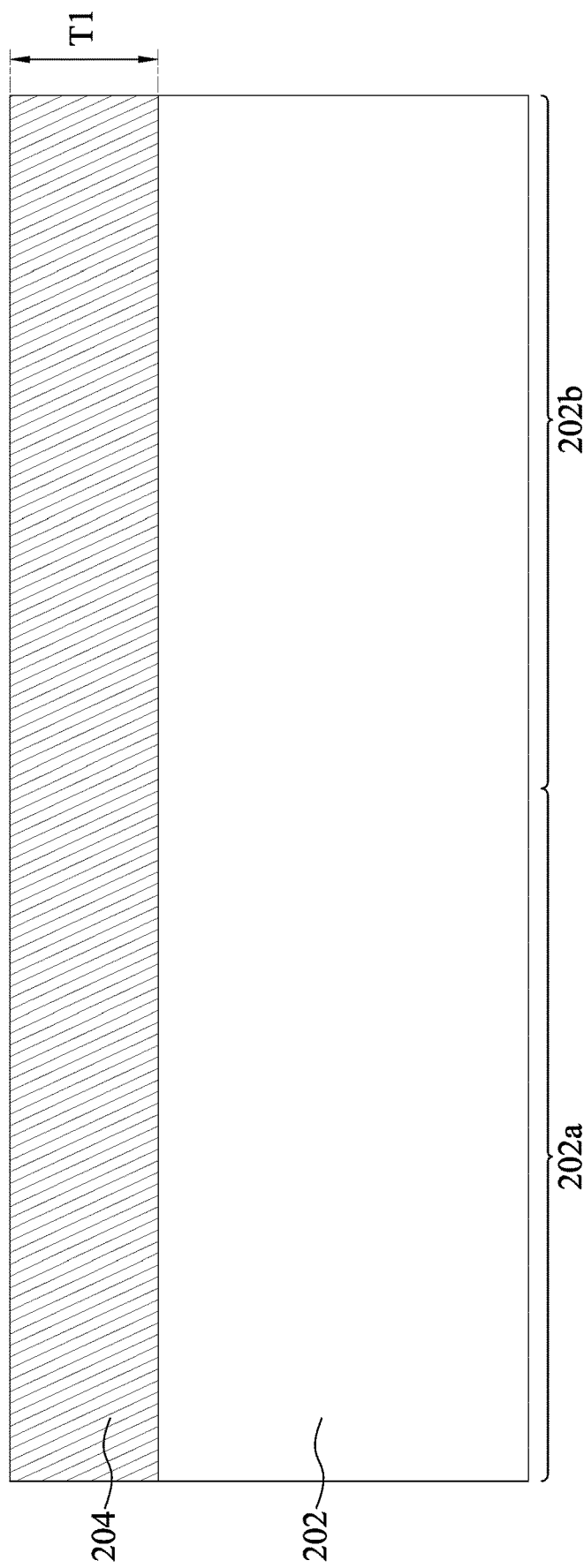
FIGS. 5A to 5C are cross-sectional views illustrating a semiconductor structure at different fabrication stages constructed according to aspects of one or more embodiments of the present disclosure.
Figure 5B:
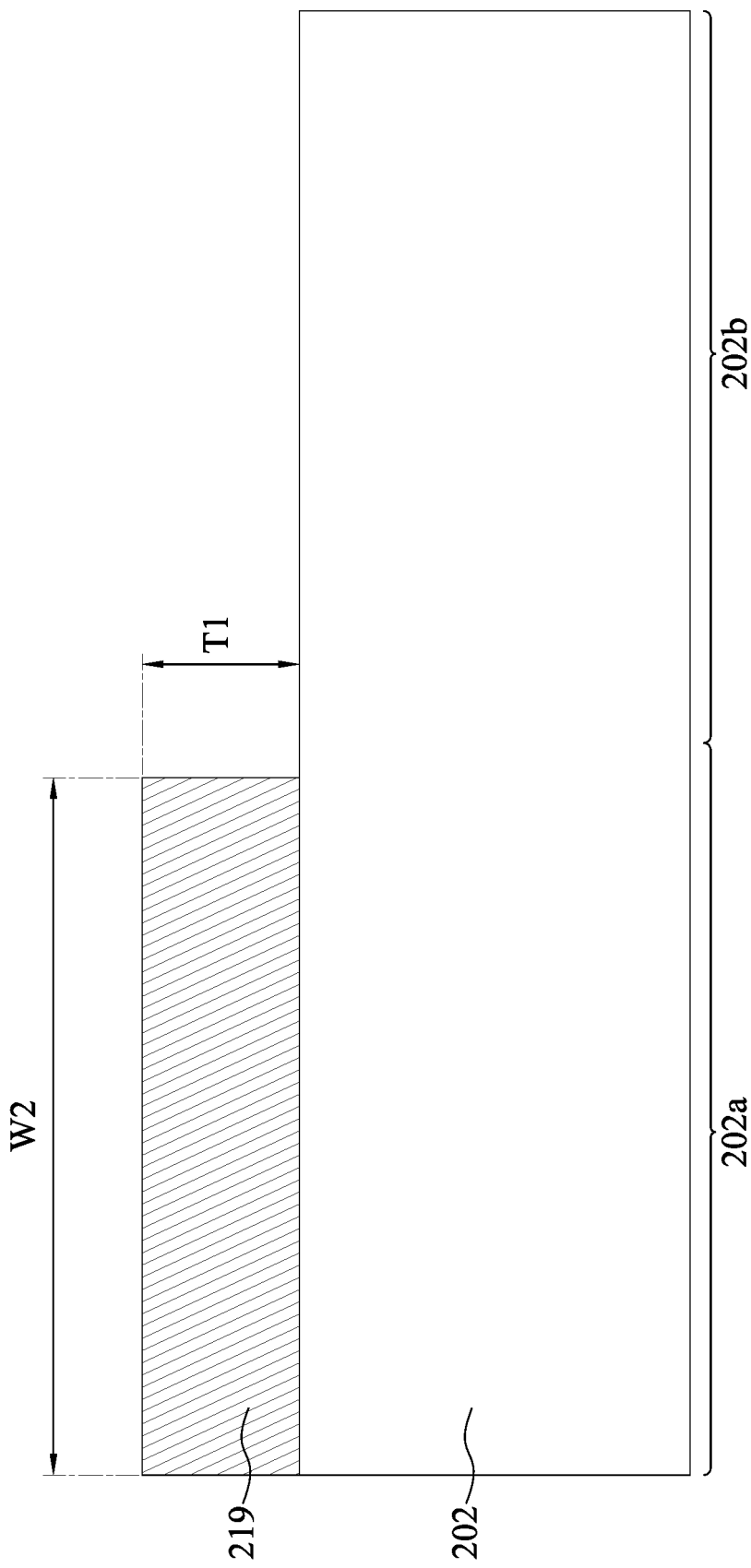
Figure 5C:
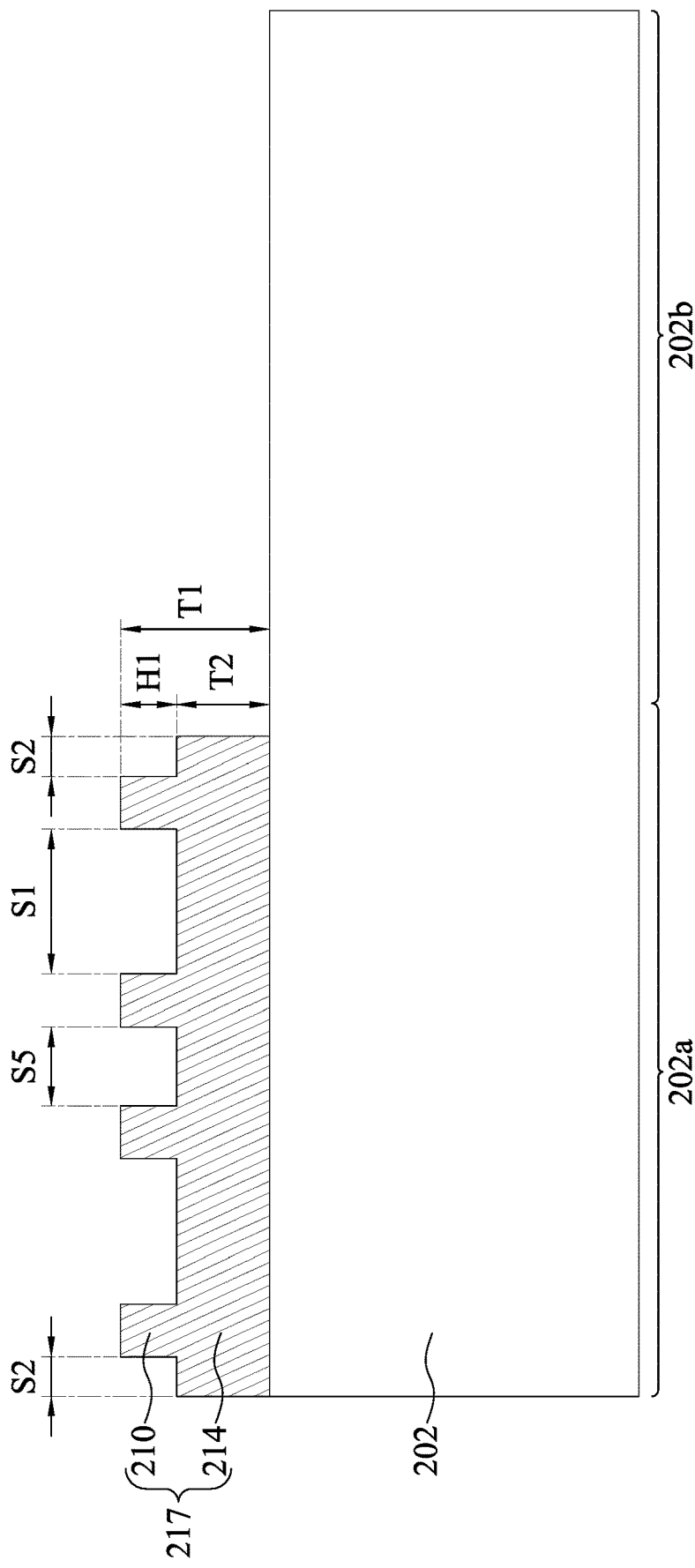

FIGS. 5A to 5C are cross-sectional views illustrating the semiconductor structure 300 at different fabrication stages constructed according to aspects of one or more embodiments of the present disclosure. FIGS. 5A to 5C illustrate an alternative approach to obtaining the dielectric structure 217.

Referring to FIG. 5A, the semiconductor substrate 202 is received or formed. Furthermore, the dielectric layer 204 is formed over the semiconductor substrate 202.

Referring to FIG. 5B, the dielectric layer 204 (FIG. 5A) in the second region 202b is removed. In some embodiments, the dielectric layer 204 in the second region 202b is removed by etching. The etching may be performed through a dry etching process using an etching gas. The etching may also be performed through a wet etching process using an etching solution. As a result of the etching, an upper surface of the semiconductor substrate 202 in the second region 202b is exposed. Remaining portions of the dielectric layer 204 form one or more dielectric structures 219. The dielectric structure 219 may have a thickness T1 and a width W2. The width W2 is configured to define a space for forming or accommodating the first transistor 250 (FIG. 4F). The width W2 is selected such that the space can meet the requirements for forming the first transistor 250. In some embodiments, the width W2 is substantially in a range from about 100 nanometers to about 500 nanometers.

Referring to FIG. 5C, the dielectric structure 219 (FIG. 5B) is etched to form one or more isolation structures 210 in the first region 202b. In some embodiments, a hard mask layer (not shown) is formed over the dielectric structure 219 and is then patterned through a patterned photoresist (not shown) to form openings exposing portions of the dielectric structure 219. The exposed portions of the dielectric structure 219 are etched through the openings of the patterned hard mask layer. The patterned hard mask layer is then removed. The remaining portion of the dielectric structure 219 forms the dielectric structure 217, which may include the base structure 214 and the isolation structures 210.

Figure 6:
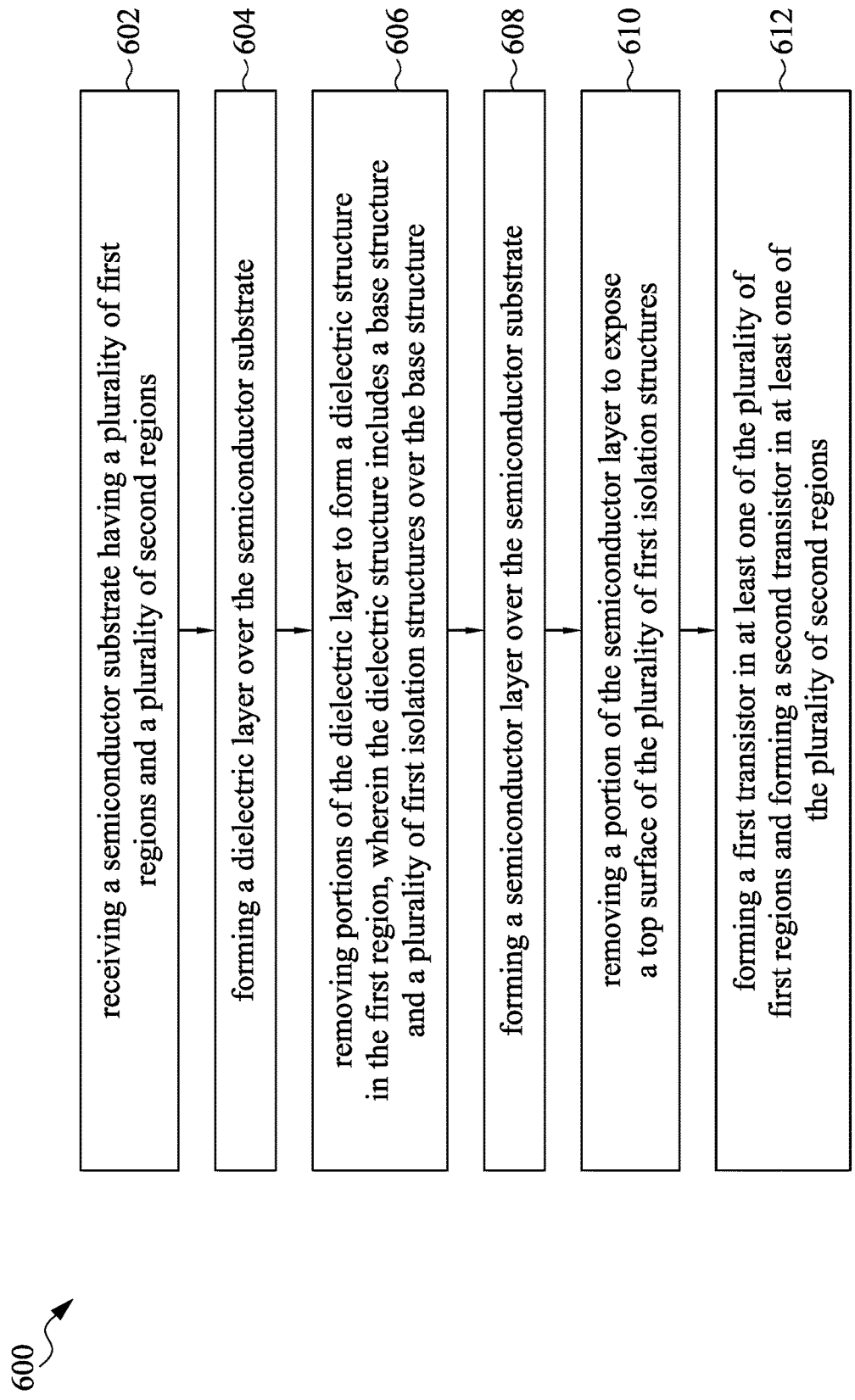
FIG. 6 is a flowchart representing a method for forming a semiconductor structure according to aspects of one or more embodiments of the present disclosure.

FIG. 6 is a flowchart representing a method 600 for forming a semiconductor structure according to aspects of one or more embodiments of the present disclosure. The method 600 for forming the semiconductor structure includes an operation 602, in which a semiconductor substrate is received. In some embodiments, the semiconductor substrate has a plurality of first regions and a plurality of second regions. The method 600 further includes an operation 604, in which a dielectric layer is formed over the semiconductor substrate. In some embodiments, the dielectric layer has a first thickness. The method 600 further includes an operation 606, in which portions of the dielectric layer are removed to form a dielectric structure in the first region. In some embodiments, the dielectric structure includes a base structure and a plurality of first isolation structures over the base structure. In some embodiments, the base structure has a second thickness, the plurality of first isolation structures has a first height, and the first thickness is substantially equal to a sum of the second thickness and the first height. The method 600 further includes an operation 608, in which a semiconductor layer is formed over the semiconductor substrate. The method 600 further includes an operation 610, in which a portion of the semiconductor layer is removed to expose a top surface of the plurality of first isolation structures. The method 600 further includes an operation 612, in which a first transistor is formed in at least one of the plurality of first regions and a second transistor is formed in at least one of the plurality of second regions. In some embodiments, the first transistor is separated from the second transistor by at least one of the plurality of first isolation structures.

The method is described for a purpose of illustrating concepts of the present disclosure and the description is not intended to limit the present disclosure beyond what is explicitly recited in the claims. Additional operations can be provided before, during, and after the method illustrated above and in FIG. 6, and some operations described can be replaced, eliminated, or moved around for additional embodiments of the method.

FIGS. 7A to 7F are cross-sectional views illustrating a semiconductor structure 700 at different fabrication stages constructed according to aspects of one or more embodiments of the present disclosure.

Figure 7A:
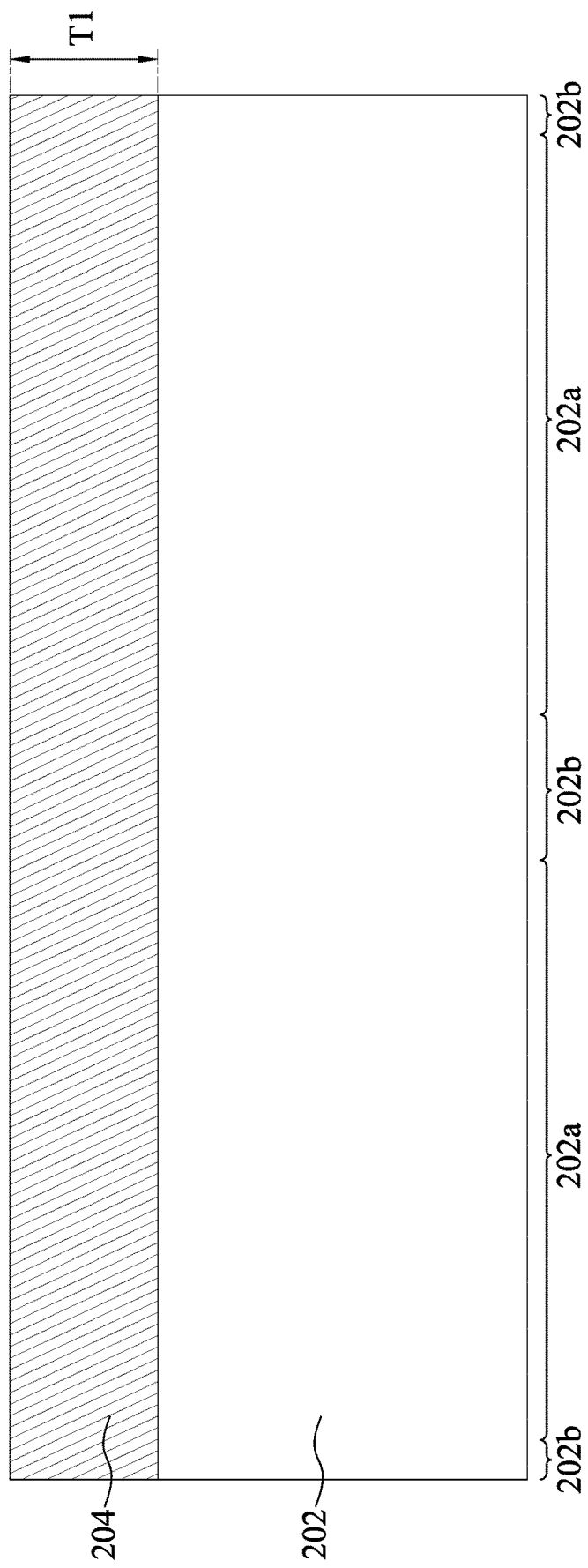
FIGS. 7A to 7F are schematic cross-sectional views illustrating a semiconductor structure at different fabrication stages constructed according to aspects of one or more embodiments of the present disclosure.

Referring to FIG. 7A, a semiconductor substrate 202 is received or formed. The respective step is shown as operation 602 of the method 600 in FIG. 6. The semiconductor substrate 202 may include various device regions. In some embodiments, the semiconductor substrate 202 includes one or more first regions 202a and one or more second regions 202b. The first region 202a and the second region 202b may include different devices. For example, the first region 202a is a radio frequency (RF) region in which a first transistor 250 (see FIG. 7F) is to be formed. The second region 202b is a logic region in which a second transistor 260 (see FIG. 7F) is to be formed. In some embodiments, at least one of the first regions 202a is disposed between two adjacent second regions 202b. In some embodiments, at least one of the second regions 202b is disposed between two adjacent first regions 202a.

Still referring to FIG. 7A, a dielectric layer 204 is formed over the semiconductor substrate 202. The respective step is shown as operation 604 of the method 600 in FIG. 6. The dielectric layer 204 has a thickness T1 substantially less than or equal to a thickness of the semiconductor substrate 202. In some embodiments, the thickness T1 of the dielectric layer 204 is substantially in a range from about 200 nanometers to about 400 nanometers.

Figure 7B:
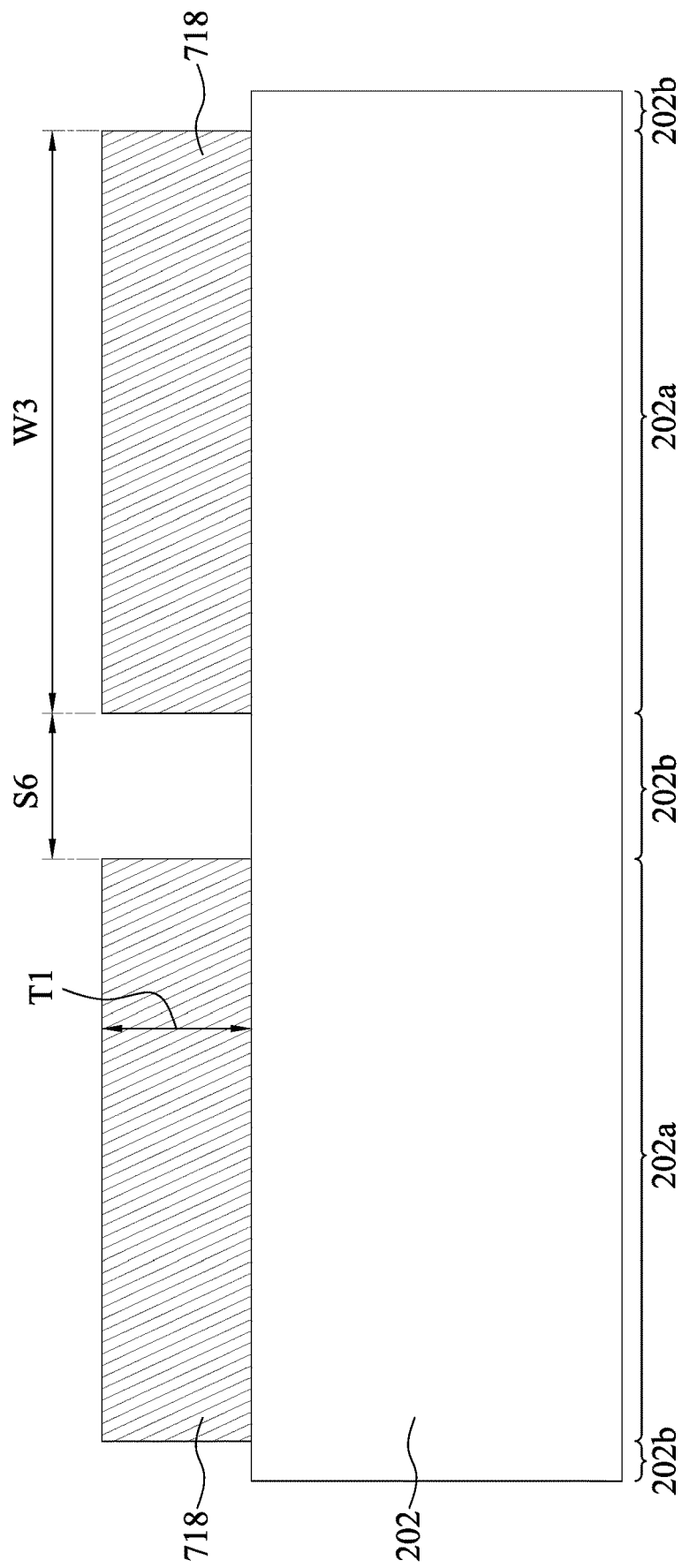
Figure 7C:
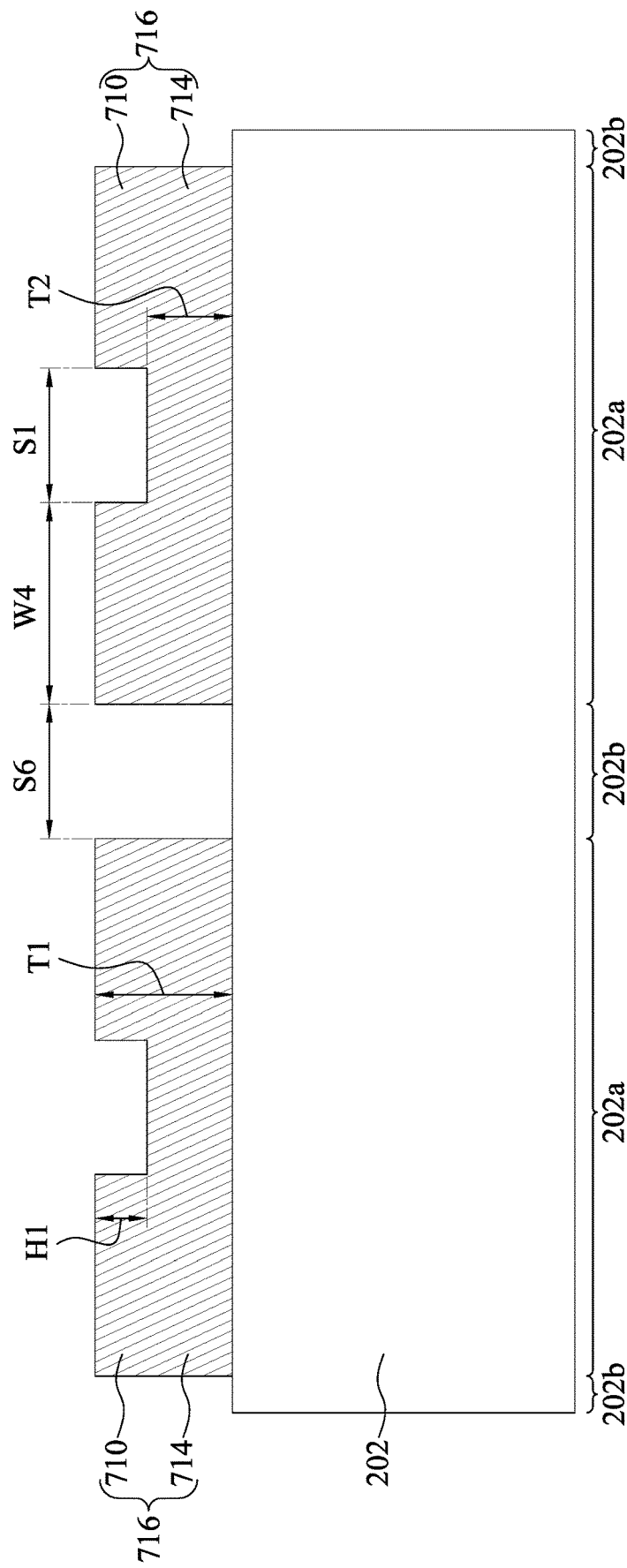

FIGS. 7B to 7C illustrate the formation of one or more dielectric structures 716. Referring to FIGS. 7B and 7C, portions of the dielectric layer 204 are removed to form a dielectric structure 716 in the first region 202a. The respective step is shown as operation 606 of the method 600 in FIG. 6.

Referring to FIG. 7B, the dielectric layer 204 (FIG. 7A) in the second region 202b is removed to expose the semiconductor substrate 202 in the second region 202b. In some embodiments, the dielectric layer 204 in the second region 202b is removed by etching. As a result of the etching, an upper surface of the semiconductor substrate 202 in the second region 202b is exposed. Remaining portions of the dielectric layer 204 form one or more dielectric structures 718. The dielectric structure 718 may have the thickness T1 and a width W3. The width W3 is configured to define a space for forming or accommodating the first transistor 250 (FIG. 7F). The width W3 is selected such that the space can meet the requirements for forming the first transistor 250. In some embodiments, the width W3 is substantially in a range from about 100 nanometers to about 800 nanometers. A spacing distance S6 is between two adjacent dielectric structures 718. The spacing distance S6 is configured to define a space for forming or accommodating the second transistor 260 (FIG. 7F). The spacing distance S6 is selected such that the space can meet the requirements for forming the second transistor 260. In some embodiments, a spacing distance S6 between two adjacent dielectric structures 718 is substantially in a range from about 50 nanometers to about 150 nanometers.

Referring to FIG. 7C, the dielectric structures 718 (FIG. 7B) are etched to form one or more isolation structures 710 in the first region 202a. In some embodiments, a hard mask layer (not shown) is formed over the dielectric structure 718 and is then patterned through a patterned photoresist (not shown) to form openings exposing portions of the dielectric structure 718. The exposed portions of the dielectric structure 718 are etched through the openings of the patterned hard mask layer. The patterned hard mask layer is then removed. The remaining portion of the dielectric structure 718 forms the dielectric structure 716. The dielectric structure 716 includes a base structure 714 and one or more isolation structures 710. The base structure 714 has a thickness T2 and the isolation structure 710 has a height H1 and a width W4. In some embodiments, and the thickness T1 is substantially equal to a sum of the thickness T2 and the height H1. The height H1 and the width W4 of the isolation structure 710 are selected such that the semiconductor layer 720 (FIG. 7D) to be formed may cover the isolation structure 710. In some embodiments, the thickness T2 of the base structure 714 is substantially in a range from about 150 nanometers to about 350 nanometers. In some embodiments, the height H1 of the isolation structures 710 is substantially in a range from about 50 nanometers to about 150 nanometers. In some embodiments, the width W4 of the isolation structure 710 is substantially in a range from about 50 nanometers to about 150 nanometers.

Alternatively, the dielectric structure 716 can be formed by etching the dielectric layer 204 to form the isolation structures 710 in the first region 202a. After the isolation structures 710 are formed, the portion of the dielectric layer 204 in the second region 202b is removed to expose the semiconductor substrate 202 in the second region 202b.

Figure 7D:
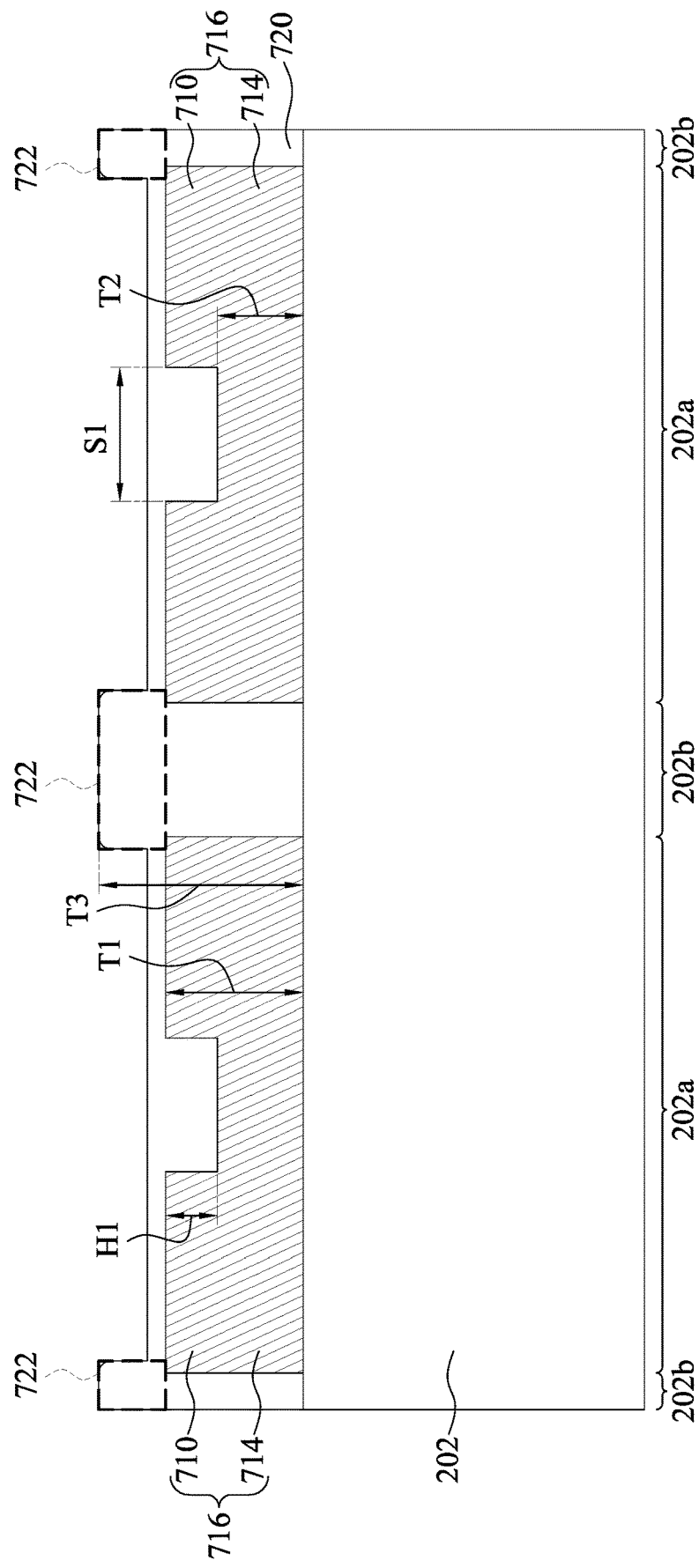

Referring to FIG. 7D, a semiconductor layer 720 is formed. The respective step is shown as operation 608 of the method 600 in FIG. 6. In some embodiments, the semiconductor layer 720 is formed over the semiconductor substrate 202. The semiconductor layer 720 may be formed to cover the first region 202a and the second region 202b. In some embodiments, the semiconductor layer 720 is formed on the exposed surface of the semiconductor substrate 202 by an epitaxial growth process. The epitaxial growth may occur on the exposed surface of the semiconductor substrate 202. In some embodiments, the semiconductor layer 720 is grown to a thickness T3 greater than the thickness T2 of the base structure 714. In some embodiments, the semiconductor layer 720 is grown to a thickness T3 greater than a sum of the thickness T2 of the base structure 714 and the height H1 of the isolation structure 710.

A portion of the semiconductor layer 720 having a thickness greater than a sum of the thickness T2 and the height H1 may be regarded as an overfill portion 722 of the semiconductor layer 720. The epitaxial growth of the semiconductor layer 720 may proceed laterally from the overfill portion 722 of the semiconductor layer 720 and extend over the exposed surface of the dielectric structure 716. In other words, the forming of the semiconductor layer 720 includes forming the semiconductor layer 720 over the dielectric structure 716 and filling a space between two adjacent isolation structures 710 with the semiconductor layer 720 by the epitaxial growth process. In some embodiments, the semiconductor layer 720 includes a same material as the semiconductor substrate 202 and has a same crystallographic orientation. In alternative embodiments, the semiconductor layer 720 is formed using any suitable technique, such as LPCVD, PECVD, or ALD.

Figure 7E:
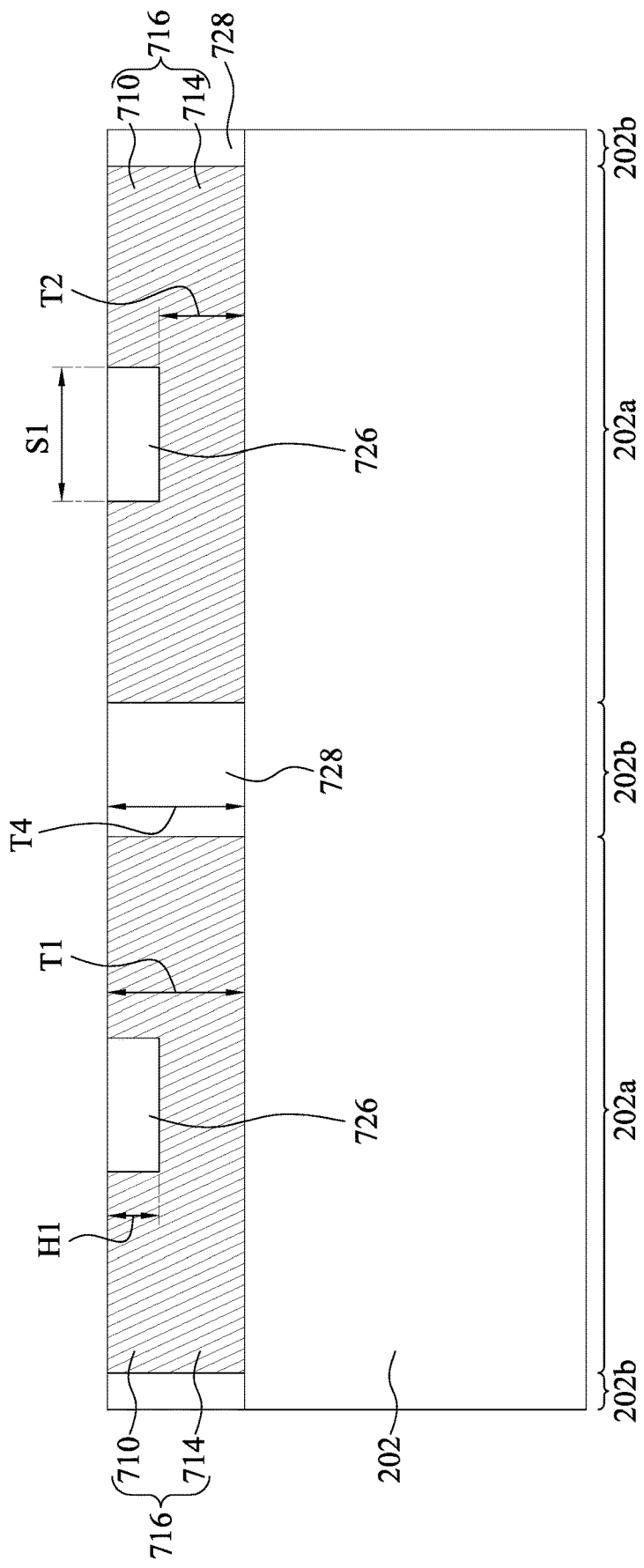
Figure 7F:
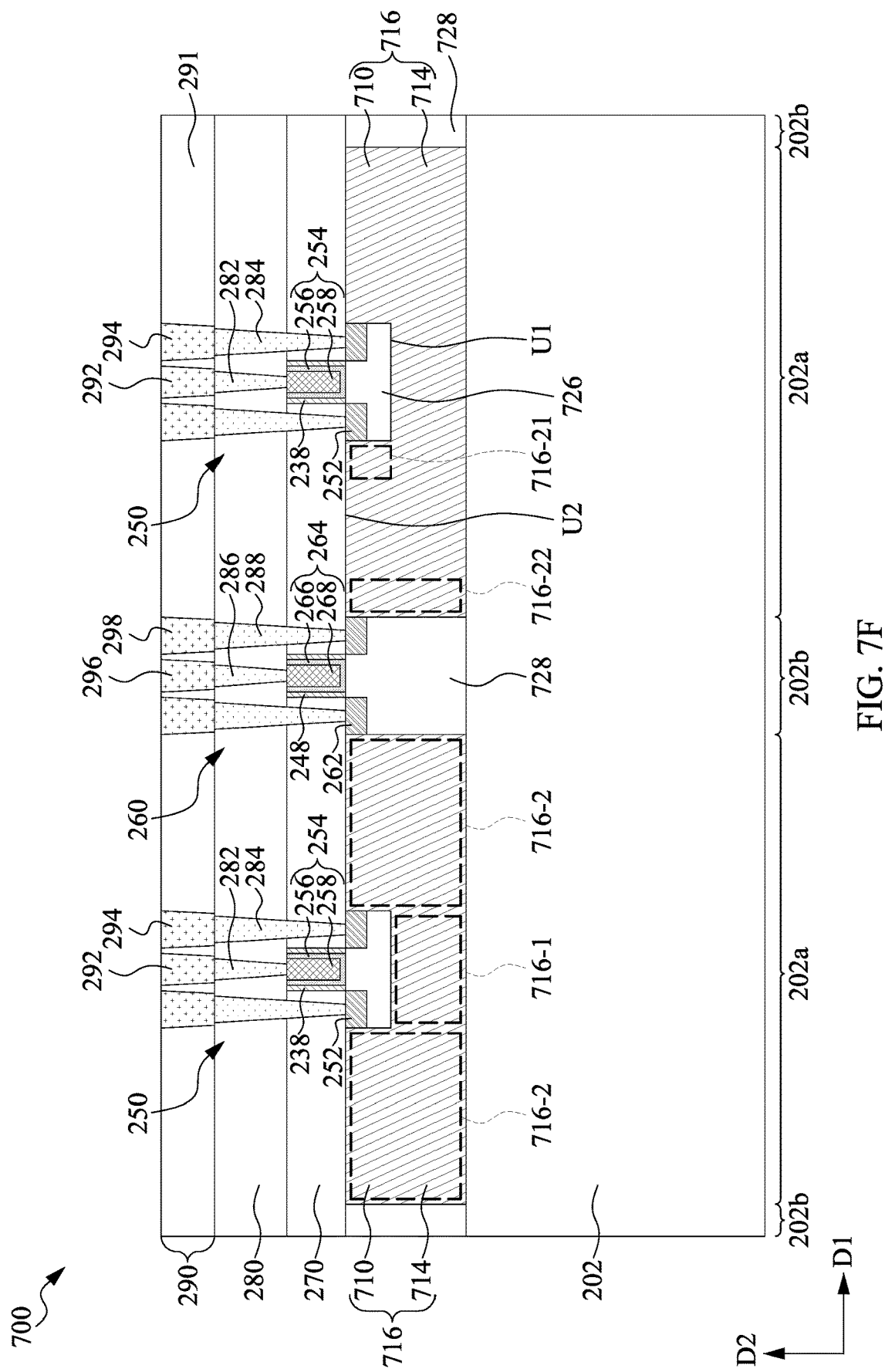

Referring to FIG. 7E, a portion of the semiconductor layer 720 is removed to expose a top surface of the isolation structure 710. The respective step is shown as operation 610 of the method 600 in FIG. 6. In some embodiments, the portion of the semiconductor layer 720 is removed by a planarization operation such as a chemical mechanical polish (CMP) operation. The planarization operation is performed to remove excess portions of the semiconductor layer 720 over the top surface of the isolation structures 210, resulting in a first semiconductor layer 726 in the first region 202a and a second semiconductor layer 728 in the second region 202b. In some embodiments, an upper surface of the first semiconductor layer 726 and an upper surface of the second semiconductor layer 728 are substantially level with the top surfaces of the isolation structures 710. The second semiconductor layer 728 has a thickness T4. In some embodiments, a sum of the thickness T2 and the height H1 is substantially equal to the thickness T4.

Referring to FIG. 7F, operations similar to those described with reference to FIGS. 2F to 2L can be repeated for forming one or more first transistors 250 in the first regions 202a and one or more second transistors 260 in the second regions 202b. The respective step is shown as operation 612 of the method 600 in FIG. 6. The first transistor 250 includes the gate electrode 258, the gate dielectric 256, and the source/drain regions 252. The second transistor 260 includes the gate electrode 268, the gate dielectric 266, and the source/drain regions 262. In accordance with some embodiments, the first transistor 250 is an RF device, while the second transistor 260 is a logic device. In some embodiments, the first transistor 250 is a partially depleted transistor. In some embodiments, the first transistor 250 and the second transistor 260 are separated from each other by the isolation structures 210.

Alternatively or additionally, operations similar to those described with reference to FIGS. 2M to 2N can be repeated for forming an ILD layer 270 and a dielectric layer 280 over the first and second transistors 250 and 260. Furthermore, contact plugs 282, 284, 286 and 288 are formed in the dielectric layer 280 and the ILD layer 270. An interconnect structure 290 can be arranged over the dielectric layer 280. The interconnect structure 290 may comprise one or more inter-metal dielectric (IMD) layers 291. The IMD layer 291 may surround one or more metal wires (or metal vias) 292, 294, 296 and 298.

Still referring to FIG. 7F, the dielectric structure 716 may have a concave profile. The dielectric structure 716 has a first upper boundary U1 lower than an upper surface of the semiconductor layer 220. The dielectric structure 716 has a second upper boundary U2 substantially level with the upper surface of the semiconductor layer 220. The dielectric structure 716 may have a first portion 716-1 extending along a first direction D1 and one or more second portions 716-2 extending along a second direction D2. The first portion 716-1 and the second portion 716-2 are connected to each other. The first portion 716-1 and the second portion 716-2 together form the concave profile. In some embodiments, the first direction D1 is substantially a lateral direction, and the second direction D2 is substantially a vertical direction.

In some embodiments, the first transistor 250 is separated from the second transistor 260 by the dielectric structure 716. In some embodiments, the first transistor 250 is separated from the second transistor 260 by the second portion 716-2 of the dielectric structure 716. In some embodiments, at least a sub-portion 716-21 of the second portion 716-2 is configured as an isolation structure of the first transistor 250. In some embodiments, at least a sub-portion 716-22 of the second portion 716-2 is configured as an isolation structure of the second transistor 260. In some embodiments, the first transistor 250 is separated from the second transistor 260 by the sub-portion 716-21 and the sub-portion 716-22.

The proposed method for forming the semiconductor structure provides advantages. The proposed method for forming the semiconductor structure includes forming the isolation structures (e.g., the sub-portion 716-21 and the sub-portion 716-22) of different devices in a single operation, e.g., operation 606. The isolation structures of different devices are connected to each other. The proposed method includes defining different portions of the dielectric structure in separate steps. Hence, greater packing density and lower manufacturing costs may be achieved. Furthermore, the proposed method provides a structure substantially free of interface between the isolation structures 710 and the base structure 714. Accordingly, better dielectric isolation and lower leakage may be achieved.

In accordance with some embodiments of the present disclosure, a method for forming a semiconductor structure is provided. The method includes receiving a semiconductor substrate having a first region and a second region; forming a dielectric layer over the semiconductor substrate; removing portions of the dielectric layer to form a dielectric structure in the first region, wherein the dielectric structure includes a base structure and a plurality of first isolation structures over the base structure; forming a semiconductor layer covering the first region and the second region; removing a portion of the semiconductor layer to expose a top surface of the plurality of first isolation structures; and forming a plurality of second isolation structures in the second region.

In accordance with some embodiments of the present disclosure, a method for forming a semiconductor structure is provided. The method includes receiving a semiconductor substrate having a plurality of first regions and a plurality of second regions; forming a dielectric layer over the semiconductor substrate, wherein the dielectric layer has a first thickness; removing portions of the dielectric layer to form a dielectric structure in the first region, wherein the dielectric structure includes a base structure and a plurality of first isolation structures over the base structure, the base structure has a second thickness, the plurality of first isolation structures has a first height, and the first thickness is substantially equal to a sum of the second thickness and the first height; forming a semiconductor layer over the semiconductor substrate; removing a portion of the semiconductor layer to expose a top surface of the plurality of first isolation structures; and forming a first transistor in at least one of the plurality of first regions and forming a second transistor in at least one of the plurality of second regions, wherein the first transistor is separated from the second transistor by at least one of the plurality of first isolation structures.

In accordance with some embodiments of the present disclosure, a semiconductor structure is provided. The semiconductor structure includes a semiconductor substrate having a first region and a second region; a first semiconductor layer over the semiconductor substrate and located in the first region; a dielectric structure over the semiconductor substrate and located in the second region, the dielectric structure having a first upper boundary lower than an upper surface of the first semiconductor layer, wherein the dielectric structure has a first portion extending along a first direction and a second portion extending along a second direction, and the first portion and the second portion are connected to each other; a second semiconductor layer over the first portion of the dielectric structure; a first transistor over the first semiconductor layer and located in the first region; and a second transistor over the second semiconductor layer and located in the second region.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   receiving a semiconductor substrate having a first region and a second region;
   forming a dielectric layer over the semiconductor substrate;
   removing portions of the dielectric layer to form a dielectric structure in the first region, wherein the dielectric structure includes a base structure and a plurality of first isolation structures over the base structure;
   forming a semiconductor layer covering the first region and the second region;
   removing a portion of the semiconductor layer to expose a top surface of the plurality of first isolation structures; and
   forming a plurality of second isolation structures in the second region.

2. The method of claim 1, wherein the plurality of first isolation structures has a first height and the plurality of second isolation structures has a second height different from the first height.

3. The method of claim 2, wherein the second height is greater than the first height.

4. The method of claim 2, wherein the second height is substantially equal to a sum of a thickness of the base structure and the first height.

5. The method of claim 1, wherein the removing of portions of the dielectric layer to form the dielectric structure in the first region comprises:
   etching the dielectric layer to form the plurality of first isolation structures in the first region; and
   removing the dielectric layer in the second region to expose the semiconductor substrate in the second region.

6. The method of claim 5, wherein the etching of the dielectric layer to form the plurality of first isolation structures in the first region is performed prior to the removing of the dielectric layer in the second region to expose the semiconductor substrate in the second region.

7. The method of claim 5, wherein the etching of the dielectric layer to form the plurality of first isolation structures in the first region is performed after the removing of the dielectric layer in the second region to expose the semiconductor substrate in the second region.

8. The method of claim 1, wherein the forming of the semiconductor layer covering the first region and the second region comprises an epitaxial growth process.

9. The method of claim 8, wherein the semiconductor layer is grown to a thickness greater than a thickness of the base structure.

10. The method of claim 8, wherein the semiconductor layer is grown to a thickness greater than a sum of a thickness of the base structure and a first height of the plurality of first isolation structures.

11. The method of claim 8, wherein the forming of the semiconductor layer comprises laterally growing the semiconductor layer on an upper surface of the dielectric structure.

12. A method for forming a semiconductor structure, comprising:
    receiving a semiconductor substrate having a plurality of first regions and a plurality of second regions;
    forming a dielectric layer over the semiconductor substrate, wherein the dielectric layer has a first thickness;
    removing portions of the dielectric layer to form a dielectric structure in the first region, wherein the dielectric structure includes a base structure and a plurality of first isolation structures over the base structure, the base structure has a second thickness, the plurality of first isolation structures has a first height, and the first thickness is substantially equal to a sum of the second thickness and the first height;
    forming a semiconductor layer over the semiconductor substrate;
    removing a portion of the semiconductor layer to expose a top surface of the plurality of first isolation structures; and
    forming a first transistor in at least one of the plurality of first regions and forming a second transistor in at least one of the plurality of second regions, wherein the first transistor is separated from the second transistor by at least one of the plurality of first isolation structures.

13. The method of claim 12, wherein at least one of the plurality of first regions is between two adjacent second regions of the plurality of second regions.

14. The method of claim 12, wherein at least two first regions of the plurality of first regions are next to each other.

15. The method of claim 12, further comprising: forming a plurality of second isolation structures in the plurality of second regions.

16. The method of claim 12, wherein the forming of a semiconductor layer over the semiconductor substrate further comprises:
    forming the semiconductor layer over the dielectric layer and filling a space between two adjacent first isolation structures of the plurality of first isolation structures with the semiconductor layer by an epitaxial growth process.

17. A method, comprising:
    forming a dielectric layer having a first thickness over a semiconductor substrate;
    patterning the dielectric layer to form a plurality of areas of the patterned dielectric layer having a second thickness, the second thickness less than the first thickness;
    removing a portion of the patterned dielectric layer from above a region of the semiconductor substrate, wherein the patterned dielectric layer provides a first isolation structure, the region extending adjacent the first isolation structure;
    depositing a semiconductor layer over the first isolation structure and the region; and
    planarizing the semiconductor layer to expose a top surface of the first isolation structure.

18. The method of claim 17, wherein the patterning the dielectric layer includes forming a hard mask over a first portion of the dielectric layer and a second portion of the dielectric layer, and etching a first region of the plurality of areas, the first region being disposed between the first portion and the second portion.

19. The method of claim 17, further comprising:
forming another isolation structure within the region, wherein the forming the another isolation structure includes etching trenches in the semiconductor layer.

20. The method of claim 17, further comprising:
forming a transistor on the semiconductor layer.

* * * * *